United States Patent [19]

Ikeda et al.

[11] Patent Number: 5,051,625

[45] Date of Patent: Sep. 24, 1991

[54] OUTPUT BUFFER CIRCUITS FOR REDUCING NOISE

[75] Inventors: Hiroshi Ikeda, Yokohama; Takashi Kimura, Zushi; Norio Fujiki, Yokohama, all of Japan

[73] Assignee: Nissan Motor Co., Ltd., Yokohama, Japan

[21] Appl. No.: 427,337

[22] Filed: Oct. 27, 1989

[30] Foreign Application Priority Data

Oct. 28, 1988 [JP] Japan ................................ 63-272462
Mar. 6, 1989 [JP] Japan ................................ 1-53315
Apr. 7, 1989 [JP] Japan ................................ 1-88636

[51] Int. Cl.$^5$ ................. H03K 19/092; H03K 19/003; H03K 19/094; H03K 17/16
[52] U.S. Cl. .................................... 307/475; 307/443; 307/451; 307/263; 307/473; 307/542
[58] Field of Search ............... 307/475, 443, 451, 448, 307/263, 585, 473, 270, 542

[56] References Cited

U.S. PATENT DOCUMENTS

| 4,074,151 | 2/1978 | Buckley, III et al. | 307/362 X |
| 4,521,701 | 6/1985 | Reddy | 307/482 X |
| 4,752,703 | 6/1988 | Lin | 307/572 X |
| 4,906,871 | 3/1990 | Iida | 307/475 X |
| 4,916,337 | 4/1990 | Leung et al. | 307/475 |
| 4,939,392 | 6/1990 | Shubat et al. | 307/473 X |

FOREIGN PATENT DOCUMENTS 61-152125  7/1986  Japan .

Primary Examiner—Stanley D. Miller
Assistant Examiner—David R. Bertelson
Attorney, Agent, or Firm—Foley & Lardner

[57] ABSTRACT

An output buffer circuit, in which a pair of current sources is connected to positive and negative power sources, and a first inverter having input and output terminals, is arranged between the current sources, in which a second inverter having input and output terminals, is connected to the output terminal of the first inverter, the second inverter including at least one of P-channel and N-channel MOSFETs, and a capacitor is connected between the input and output terminals of the second inverter.

12 Claims, 15 Drawing Sheets

113

114

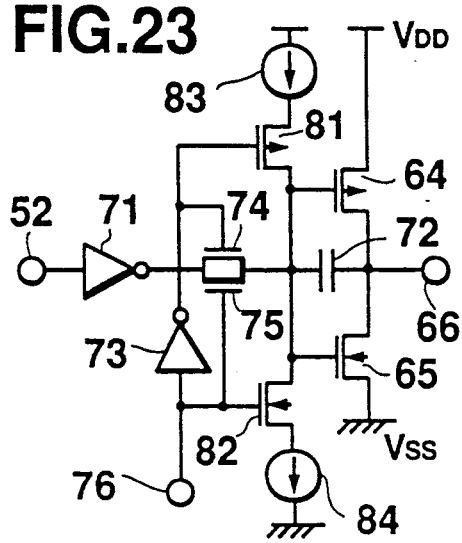
FIG.23
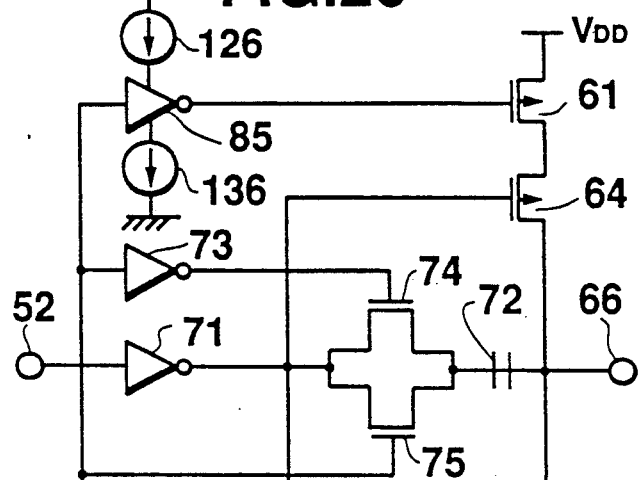
FIG.26
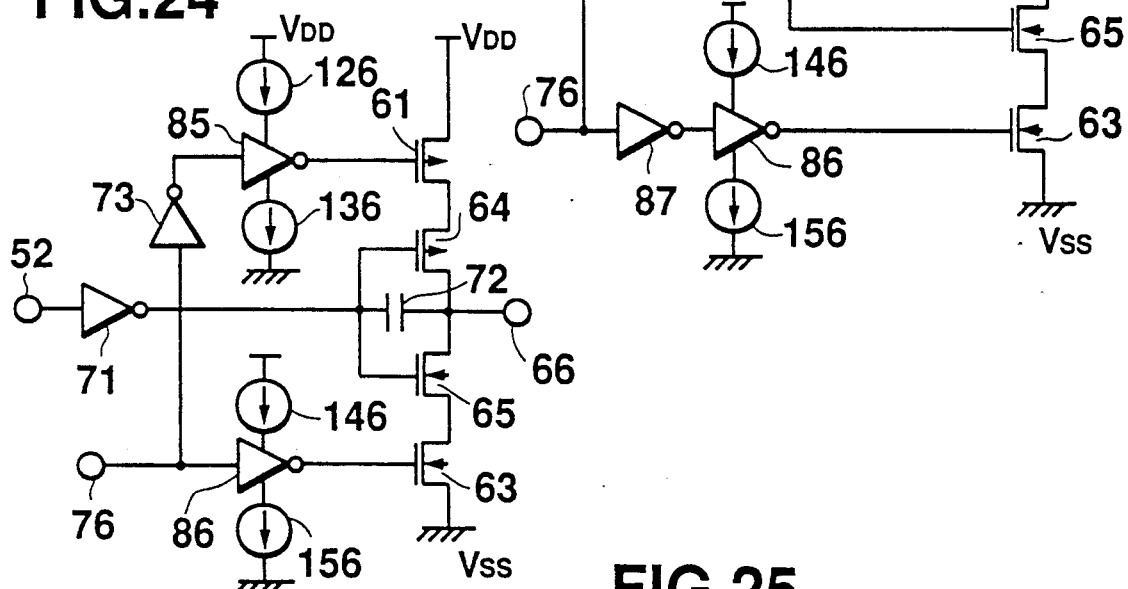
FIG.24
FIG.25
INPUT SIGNAL
ACTUATING SIGNAL
OUTPUT SIGNAL

OUTPUT BUFFER CIRCUITS FOR REDUCING NOISE

BACKGROUND OF THE INVENTION

1. Field of the Invention

The present invention relates to output buffer circuits including CMOSs for use in transfer circuits and the like for vehicles.

2. Description of the Background Art

Conventionally, an output buffer circuit generally comprises CMOSs in respect of a noise resistance problem. FIG. 1 is one example of a conventional output buffer circuit including two stages of inverters, the front inverter comprising a CMOS composed of a first MOSFET 1 of a P-channel type and a second MOSFET 2 of an N-channel type, the rear inverter comprising a CMOS composed of a third MOSFET 3 of a P-channel type and a fourth MOSFET 4 of an N-channel type. The source electrode of the first MOSFET 1 is connected to a positive power source $V_{DD}$, and the source electrode of the second MOSFET 2 is connected to a negative power source $V_{SS}$. The gate electrodes of the first and second MOSFETs 1 and 2 are connected together to an input terminal 5. The source electrode of the third MOSFET 3 is connected to the positive power source $V_{DD}$, and the source electrode of the fourth MOSFET 4 is connected to the negative power source $V_{SS}$. The gate electrodes of the third and fourth MOSFETs 3 and 4 are connected together to the drain electrodes of the first and second MOSFETs 1 and 2, and the drain electrodes of the third and fourth MOSFETs 1 and 2 are connected together to an output terminal 6 to make an inverter. When a signal is fed to the input terminal 5, the signal is inverted in the inverter and an inverted signal, as shown by a broken line in FIG. 2, is output from the output terminal 6. The waveform of the inverted output signal is affected by overshoot and impedance of electric transfer wires and thus is not entirely ideal.

When a conventional output buffer circuit of this kind is used for an output part of a pulse transfer part, a switching action often causes electromagnetic wave noise. When, in addition to the switching action, an overshoot, as shown in FIG. 2, is given to the signal, a high-frequency electromagnetic wave noise is also caused. When the output buffer circuit is employed in a transfer circuit for a multichannel communication or the like for a vehicle, the caused electromagnetic wave noise such as a radio wave noise cause trouble in a radio receiver in a vehicle. Hence, at least the radio wave band noise component in the electromagnetic wave noise generated by the output buffer circuit equipped in the pulse transfer circuit within the vehicle must be removed.

In case of an output buffer circuit used for a bus line driver within a unit, when there is a leakage path from the unit, a noise in a radio receiver is caused in the similar manner as described above.

A variety of countermeasures has been proposed for preventing this trouble caused by the electromagnetic wave noise output from the output buffer circuit.

Firstly, an RC filter is provided in the output side of the rear converter of the output buffer circuit shown in FIG. 1. That is, as shown in FIG. 3, the RC filter comprising a combination of a resister 7 and a capacitor 8 is arranged between the output side of the rear inverter and the output terminal 4. In this case, the high-frequency noise component can be decreased or removed and the leading edge of the waveform of the output signal is moderated, as shown by a broken line in FIG. 4.

Secondly, an integrator circuit is inserted in the output side of the output buffer circuit, as disclosed in Japanese Patent Laid-Open Specification No. 61-152125. As shown in FIG. 5, an integrator circuit comprises an operational amplifier 9, a resister 11, a capacitor 12, a negative input terminal 13 and a positive input terminal 14. The output signal of the output buffer circuit (not shown) is input to the negative input electrode of the operational amplifier 9 through the resister 11, and the negative input electrode and the output electrode of the operational amplifier 9 are coupled to each other through the capacitor 12. The output electrode of the operational amplifier 9 is linked to the output terminal 6. In this case, the rising and trailing timings of the output signal can be controlled, as shown by broken lines in FIG. 6.

Thirdly, as shown in FIG. 7, a Miller capacitor 15 is arranged between the input and output sides of the rear converter, that is, between the gate electrodes and the drain electrodes of the third and fourth MOSFETs 3 and 4, as disclosed in Japanese Patent Laid-Open Specification No. 61-152125.

However, in the first case, the inclinations of the leading and trailing edges of the output signal are the largest at the right after the leading and trailing start times, as shown in FIG. 4. Hence, when the resister 7 and the capacitor 8 are so determined that the inclinations of the largest inclined portions are moderated, the other moderate portions of the leading and trailing edges of the output signal are further moderated, resulting in that the pulse waveform of the entire signal is largely deformed. As a result, it becomes liable to receive the influence of other noises such as the ground noise, and the advantages of the digital communication will be reduced. Also, since the deformation of the pulse waveform also depends on the floating capacity in the output side, it is difficult to control exactly the slants at the rising and trailing of the signal. Hence, it is impossible to exactly prevent the generation of the electromagnetic wave noise in the certain frequency band such as the radio wave band.

In the second case, as shown in FIG. 6, although the inclinations at the rising and trailing of the signal can be exactly controlled, the rising and trailing start and end portions incline more steeply to cause the high-frequency noise component. In the third case, as shown in FIG. 7, since the Miller capacitor 15 is inserted between the input and output sides of the rear inverter, the AC component in the data signal input to the rear inverter always passes through the Miller capacitor 15 to the output terminal 6. As a result, the use of the pulse transfer circuit providing with the output buffer circuit may be restricted.

SUMMARY OF THE INVENTION

Accordingly, it is an object of the present invention to provide an output buffer circuit, free from the aforementioned defects and disadvantages of the prior art, which is capable of preventing generation of high-frequency noises and performing exactly a digital communication.

In accordance with one aspect of the present invention, there is provided an output buffer circuit, comprising a pair of current sources connected to positive and negative power sources, a first inverter having input and output terminals, arranged between the current sources, a second inverter having input and output terminals, connected to the output terminal of the first inverter, the second inverter including at least one of P-channel and N-channel MOSFETs, and a capacitor connected between the input and output terminals of the second inverter.

In accordance with another aspect of the present inveniton, there is provided an output buffer circuit, comprising an inverter having input and output terminals, arranged between positive and negative power sources, a capacitor connected between the input and output terminals of the inverter, and switch means for opening and closing a path between the input and output terminals of the inverter by using a control signal.

In accordance with still another aspect of the present invention, there is provided an output buffer circuit, comprising an inverter having input and output terminals, arranged between positive and negative power sources, a capacitor connected between the input and output terminals of the inverter, high impedance set means for activating the inverter when an actuating signal is input to the high impedance set means, and for changing the inverter from a low to high impedance condition when the actuating signal is not input to the high impedance set means, and current restriction means for moderating a current value variation of the actuating signal during the change between the low and high impedance conditions.

BRIEF DESCRIPTION OF THE DRAWINGS

FIG. 22a is a block diagram of a data transfer circuit of a bus line, to which an output buffer circuit according to the present invention is applied, and FIGS. 22b and 22c are explanatory circuit diagrams of output buffer circuits used in FIG. 22a;

FIGS. 23 and 24 are circuit diagrams of twelfth and thirteenth embodiments of an output buffer circuit according to the present invention;

FIG. 25 is a timing chart of pulse signals for showing action of the circuits shown in FIGS. 23 and 24; and FIG. 26 is a circuit diagram of a fourteenth embodiment of an output buffer circuit according to the present invention.

DESCRIPTION OF THE PREFERRED EMBODIMENT

Figure 8:
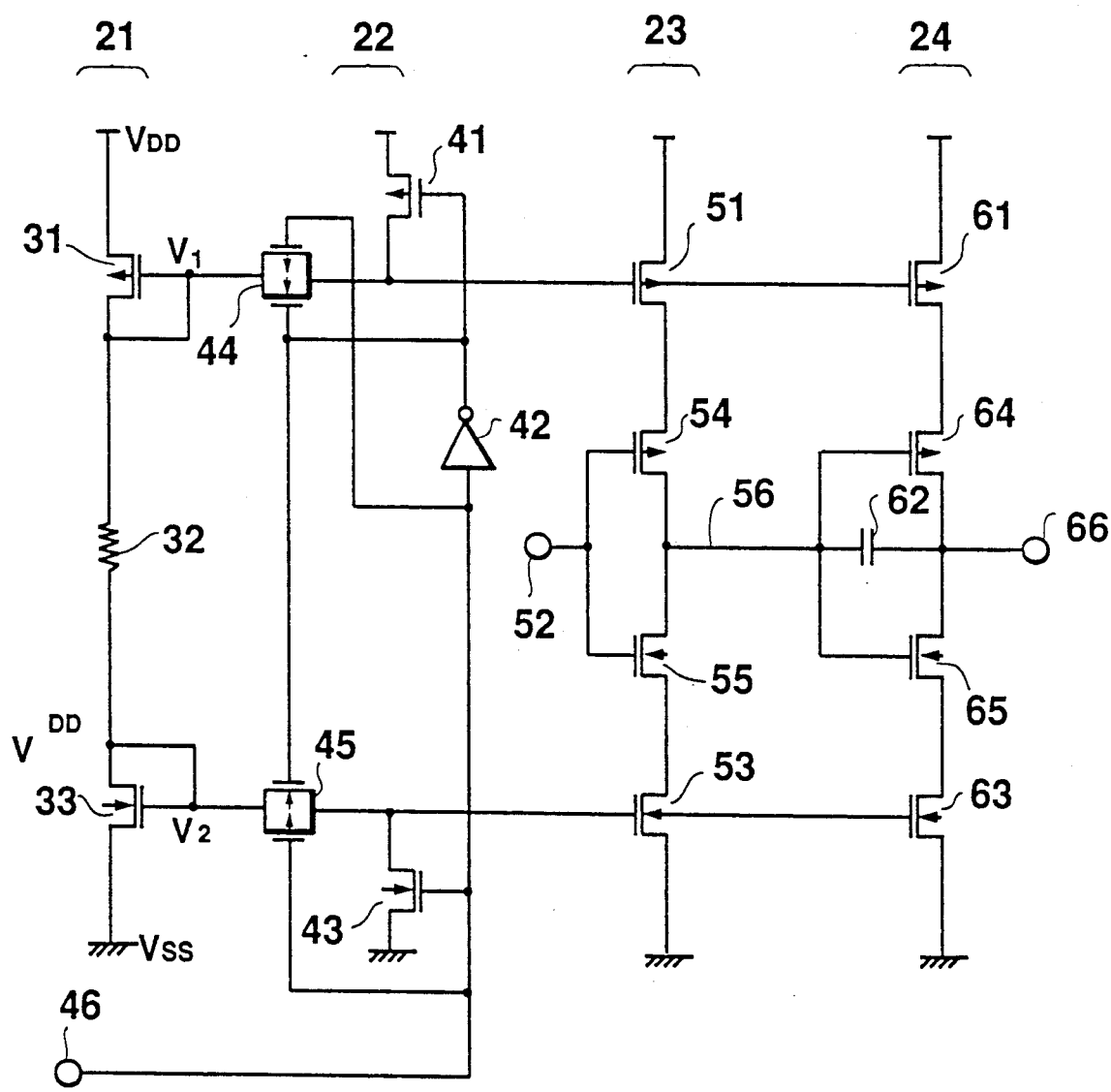
FIG. 8 is a circuit diagram of a first embodiment of an output buffer circuit according to the present invention.

Referring now to the drawings, wherein like reference characters designate like or corresponding parts throughout the several views, there is shown in FIG. 8 the first embodiment of an output buffer circuit according to the present invention.

The output buffer circuit comprises a reference voltage generation circuit 21, a high impedance (HZ) set circuit 22, an input stage circuit 23 and an output stage circuit 24.

The reference voltage generation circuit 21 includes a P-channel MOSFET 31, a resistor 32 and an N-channel MOSFET 33, and these three members are arranged in series between a positive power source $V_{DD}$ and a negative power source $V_{SS}$ such as the ground (GND). The drain electrode of the P-channel MOSFET 31 is connected to the gate electrode thereof, and a first reference voltage $V_1$ is output from the gate electrode of the P-channel MOSFET 31. The drain electrode of the N-channel MOSFET 33 is connected to the gate electrode thereof, and a second reference voltage $V_2$ is output from the gate electrode of the N-channel MOSFET 33.

The HZ set circuit 22 includes a P-channel MOSFET 41, an inverter 42, an N-channel MOSFET 43, first and second transfer gates 44 and 45 and a control terminal 46, and the members 41 to 45 are arranged between the positive and negative power sources $V_{DD}$ and $V_{SS}$. The inverter 42 is connected between the gate electrodes of the MOSFETs 41 and 43.

The input stage circuit 23 includes two P-channel MOSFETs 51 and 54, two N-channel MOSFETs 55 and 53 and an input terminal 52, and the four MOSFETs 51, 54, 55 and 53 are arranged in series between the positive and negative power sources $V_{DD}$ and $V_{SS}$. The P-channel MOSFET 54 and the N-channel MOSFET 55 constitute an inverter A signal input to the input terminal 52 is sent to the coupled gate electrodes of the MOSFETs 54 and 55, and an inverted signal is output from the coupled drain electrodes of the MOSFETs 54 and 55 to the output stage circuit 24 through a node 56.

The output stage circuit 24 includes two P-channel MOSFETs 61 and 64, two N-channel MOSFETs 65 and 63, a Miller capacitor 62 and an output terminal 66, and the four MOSFETs 61, 64, 65 and 63 are arranged in series between the positive and negative power sources $V_{DD}$ and $V_{SS}$. The P-channel MOSFET 64 and the N-channel MOSFET 65 constitute an inverter. The Miller capacitor 62 is connected between the coupled gate electrodes of the MOSFETs 64 and 65 and the coupled drain electrodes thereof, the drain electrodes of the MOSFETs 64 and 65 are connected to the output terminal 66. A signal fed from the input stage circuit 23 to the coupled gate electrodes of the MOSFETs 64 and 65 is inverted in the output stage circuit 24, and an inverted signal is output from the coupled drain electrodes of the MOSFETs 64 and 65 to the output terminal 66.

In the HZ set circuit 22, the first and second transfer gates 44 and 45 are controlled to be opened or closed by a digital signal fed from an external system to the control terminal 46. That is, the digital signal fed to the control terminal 46 controls the opening or closing of the first and second transfer gates 44 and 45, i.e., to allow the first or second transfer gate 44 or 45 to pass or stop the first or second reference voltage $V_1$ or $V_2$ fed from the respective P-channel or N-channel MOSFET 31 or 33 to the drain electrode of the P-channel or N-channel MOSFET 41 or 43 and to the gate electrodes of the P-channel or N-channel MOSFETs 51 and 61 or 53 and 63 of the input and output stage circuits 23 and 24, thereby allowing the output stage circuit 24 either to output or stop the output signal from the output terminal 66.

The operation of the output buffer circuit described above will now be described in detail.

The first and second reference voltages $V_1$ and $V_2$ are represented as follows, $$V_1 = V_{DD} - (V_{THP} + \Delta_P) \tag{1}$$

$$V_2 = V_{THN} + \Delta_N \tag{2}$$

wherein the $V_{DD}$ is the power voltage, $V_{THP}$ and $V_{THN}$ are threshold voltages of the P-channel and N-channel MOSFETs 31 and 33, respectively.

$\Delta_P$ and $\Delta_N$ are represented as follows, $$\Delta_P = \sqrt{2i1/\beta P1} \tag{3}$$

$$\Delta_N = \sqrt{2i1/\beta N1} \tag{4}$$

wherein $\beta P1$ and $\beta N1$ are gains of the P-channel and N-channel MOSFETs 31 and 33, and i1 is a current flowing the resister 32. The current i1 is expressed as follows, $$i1 = (V_1 - V_2)/R \tag{5}$$

wherein R is a resistance of the resister 32. Hence, a current i2 flowing in the input stage circuit 23 is represented as follows, $$i2 = a \cdot i1 \tag{6}$$

wherein a is the size ratio of the MOSFET 51 or 53 to the MOSFET 31 or 33.

Now, when the level of the input signal at the control terminal 46 in the HZ set circuit 22 is low, i.e., the input and output stage circuits 23 and 24 are in operation and the level of the signal fed to the input terminal 52 of the input stage circuit 23 rises from low to high level voltage $V_{DD}$, the N-channel MOSFET 55 is changed to ON and the P-channel MOSFET 54 is to OFF. Thus, the current i2 flows in the N-channel MOSFET 53.

Then, the voltage of the node 56 connecting the drain electrodes of the P-channel and N-channel MOSFETs 54 and 55 and the one end of the Miller capacitor 62 falls, and the voltage at the output terminal 66 of the output stage circuit 24 increases and is inverted.

This voltage increase and inversion process at the output terminal 66 is performed as follow. When the P-channel MOSFET 54 is changed to OFF and the N-channel MOSFET 55 is to ON, the electric charge starts to flow from the node 56 to the negative power source side. At this time, the current i2 passing in the N-channel MOSFET 53 is proportional to the current i1 flowing in the resister 32, as represented in formula (6), and the voltage drop speed at the node 56 is determined, depending on the capacity of the Miller capacitor 62. As the voltage at the node 56 decreases, the voltage at the output terminal 66 increases. At the same time, while the voltage decreases at the node 56, the P-channel MOSFET 64 in the output stage circuit 24 is changed to ON through the unsaturated region, and the current passes from the positive power source side to the negative power source side in the output stage circuit 24.

Then, as the voltage at the node 56 decreases further, the N-channel MOSFET 65 is changed to OFF through the unsaturated region, and the current is passed from the positive power source side to the output terminal 66 in the output stage circuit 24. The voltage at the output terminal 66 is changed to the high level to become stable.

As described above, at the starting and ending times of the rising or leading of the high level signal fed to the input terminal 52, either P-channel or N-channel MOSFET 64 or 65 becomes the unsaturated region, the MOSFETs 64 and 65 constituting the inverter in the output stage circuit 24, and in the unsaturated region the current is output from the output electrode of the inverter, i.e., the coupled drain electrodes of the MOSFETs 64 and 65 to the output electrode 66 depending on the voltage applied to the input electrode of the inverter, i.e., the coupled gate electrodes of the MOSFETs 64 and 65, with the result of moderating the variation of the voltage at the output terminal 66.

Figure 9:
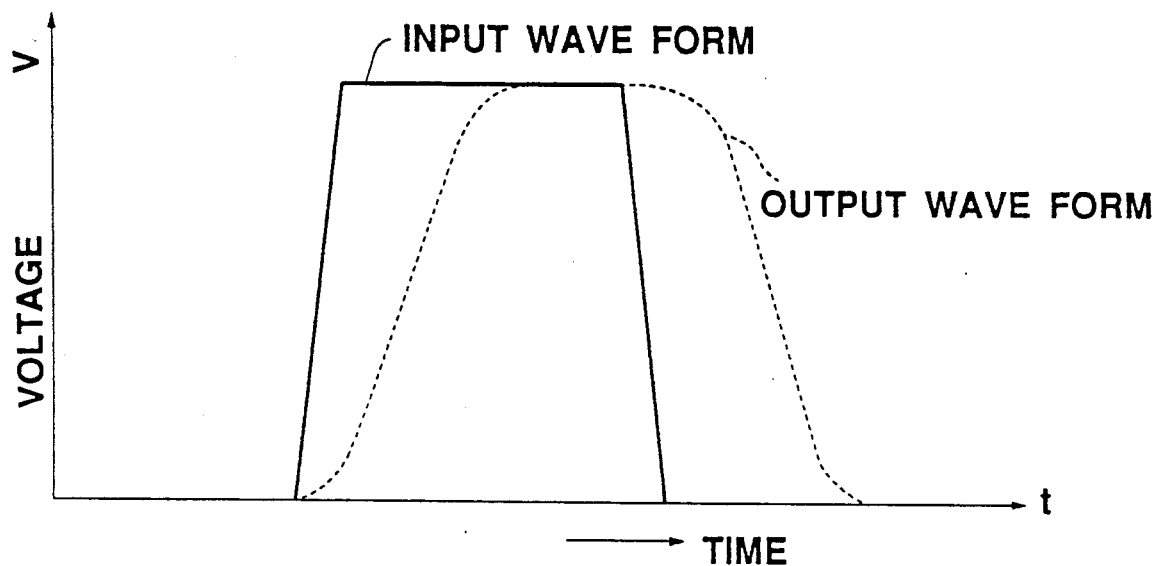
FIG. 9 is a schematic view of waveforms of input and output signals of the circuit shown in FIG. 8.

Further, in the saturated region between these upper and lower unsaturated regions of the MOSFETs 64 and 65, by the action of the Miller capacitor 62, the voltage is changed at a certain inclination $\Delta V/\Delta t = V_2/C_2$, wherein $C_2$ is the capacity of the Miller capacitor, to obtain an output waveform, as shown by a broken line in FIG. 9. In this case, the gate capacity and the floating capacity of the wiring capacitor and the like are ignored. As to the falling or trailing edge of the high level signal fed to the input terminal 52, a moderating output waveform can be also obtained in the same manner as described above.

Then, the waveform of the output signal will be described in more detail.

Figure 10:
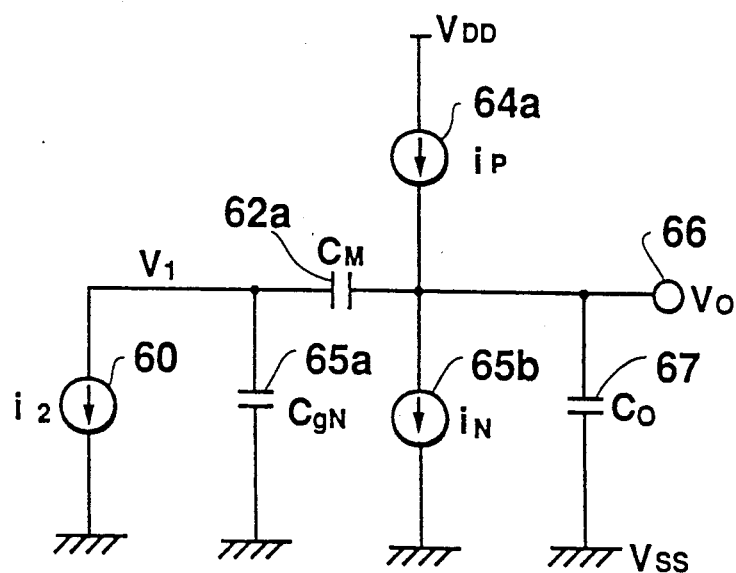
FIG. 10 is a circuit diagram of an equivalent circuit of an output buffer circuit shown in FIG. 8 at a leading start time.

In FIG. 10, there is shown an equivalent circuit of the output buffer circuit shown in FIG. 8 at the starting time of the leading of the high level signal. The input side voltage $V_1$ and an output side voltage $V_0$ are expressed by the following differential equations, $$(C_M + C_{9N}) \cdot \frac{dV_1}{dt} - C_M \cdot \frac{dV_0}{dt} = -i2 \tag{7}$$

$$(C_0 + C_M) \cdot \frac{dV_0}{dt} - C_m \cdot \frac{dV_1}{dt} = i_P - i_N \tag{8}$$

wherein $C_M$ is the capacity of the Miller capacitor, $C_{9N}$ is the gate capacity of the N-channel MOSFET 65, $C_0$ is the load capacity after the output terminal 66, and $i_P$ and $i_N$ are currents flowing in the P-channel and N-channel MOSFETs 64 and 65, respectively. The currents $i_P$ and $i_N$ are expressed as follows, $$i_P = \frac{\beta_P}{2}(V_{DD} - V_1 - |V_{TP}|)^2 \quad (9)$$

$$i_N = \beta_N(V_1 - V_{TN})V_0 \quad (10)$$

At the leading start time, the N-channel MOSFET 65 is in the unsaturated region, and thus equation (10) is applicable.

Equations (7) and (8) are solved with respect to $V_1$, the following equations are obtained.

$$C^* \cdot \frac{dV_1}{dt} = -i2 \cdot \frac{C_0}{C_M} + (i_P - i_N) \quad (11)$$

$$C^* = \frac{C_0}{C_M} \cdot (C_M + C_{9N}) - \frac{C_M C_0}{C_0 + C_M} \quad (12)$$

Since $i_N$ includes $V_0$ (equation (10)), the simultaneous equations can not be solved. Now, assuming that $C_0 >> C_M$, the second member of the right hand side in equation (11) can be omitted, and the following equation is obtained.

$$C^* \cdot \frac{dV_1}{dt} = -i2 \cdot \frac{C_0}{C_M} \quad (13)$$

Further, assuming that $C_{9N} << C_M$ and $C^* \approx C_0$, equation (13) is written as follows:

$$\frac{dV_1}{dt} = -\frac{i2}{C_M} \quad (14)$$

Equation (14) is solved in consideration of the initial conditions to obtain the following equation.

$$V_1 = V_{DD} - |V_{TP}| - \frac{i2}{C_M} \cdot t \quad (15)$$

Then, equations (7) and (8) are solved with respect to $V_0$, the following equation is obtained.

$$Ct \cdot \frac{dV_0}{dt} = -i2 \cdot \frac{C_M}{C_M + C_{9N}} + (i_P - i_N) \quad (16)$$

$$Ct = (C_0 + C_M) - \frac{C_M^2}{C_M + C_{9N}} \quad (17)$$

Equations (9), (10) and (15) are substituted for equation (16) to obtain the following equation.

$$Ct \cdot \frac{dV_0}{dt} = -i2 \cdot \frac{C_M}{C_M + C_{9N}} + \frac{\beta_P}{2} \cdot \frac{(i2t)^2}{(CM)^2} - \beta_N \cdot \left(V_{DD} - \frac{i2t}{C_M} - V_{TN}\right) \quad (18)$$

Then, the integration is carried out to obtain the following equations.

$$V_0 = At^3 + Bt^2 + Ct \quad (19)$$

$$A = \frac{\beta_P}{6} \cdot \frac{i2}{CM^2} \cdot \frac{1}{Ct}$$

$$B = \frac{\beta_N}{2} \cdot \frac{i2}{C_M} \cdot \frac{1}{Ct}$$

$$C = -\frac{i2}{Ct} \cdot \frac{C_M}{C_M + C_{9N}} - \frac{\beta_N}{Ct} \cdot$$

$$(V_{DD} \cdot |V_{TP}| - V_{TN}) < 0$$

Now, when factors A, B and C are compared with one another, A>>B>>C and hence the equation (19) is expressed by the following formula.

$$V_0 \approx At^3 \quad (20)$$

Thus, the waveform of equation (18) can approximate to that of equation (20). From equation (20), the following equation is obtained.

$$\left| \frac{dV_0}{dt} \right|_{t=0} = 0 \quad (21)$$

That is, at a leading start time, a slant of $V_0$ is determined to zero, and then a high level signal starts a rising or leading in the waveform of a curve represented by equation (20).

As described above, according to the present invention, a waveform having a moderated curve at the leading start time can be obtained, thereby preventing a generation of a high-frequency noise component.

Then, the middle potion of the rising or leading of the high level signal will be studied.

Since the N-channel MOSFET 65 in the output stage circuit 24 reaches the saturated region, the feedback is effected by the Miller capacitor 62, and the following formula is obtained.

$$\frac{dV1}{dt} \approx 0 \quad (22)$$

Hence, equation (7) is rewritten as follows.

$$C_M \cdot \frac{dV_0}{dt} = i2 \quad (23)$$

$$V_0 = \frac{i2}{C_M} \cdot t \quad (24)$$

That is, the rising of $V_0$ is effected with the slant determined by i2 and $C_M$. The capacity $C_M$ of the Miller capacitor 62 and the current i2 flowing in the input stage circuit 23 can be freely determined in the circuit, and accordingly a waveform having a desired inclination can be readily produced. As a result, waveforms with steep slopes of the leading edge can be prevented and hence the generation of the troublesome high-frequency noise component can be effectively prevented. Also, the waveform deformation due to the excessively moderated inclination can be effectively prevented to remove the problem for the digital communication.

Then, the ending portion of the rising of the high level signal can be also properly processed in the same manner as described above to obtain an output signal having a waveform of a suitably moderated leading edge, as shown in FIG. 9.

Hence, according to the present invention, the rising start and end portions of the leading edge of the high level signal can be varied in the quite suitably moderated curves, and the middle portion between the rising start and end portions of the leading edge of the high level signal can be varied at an approximately straight linear inclination which can be freely determined in the circuit.

Relating to the falling or trailing edge of the high level signal, an appropriately varied waveform of an output signal can be obtained in the same manner as described above.

Figure 11:
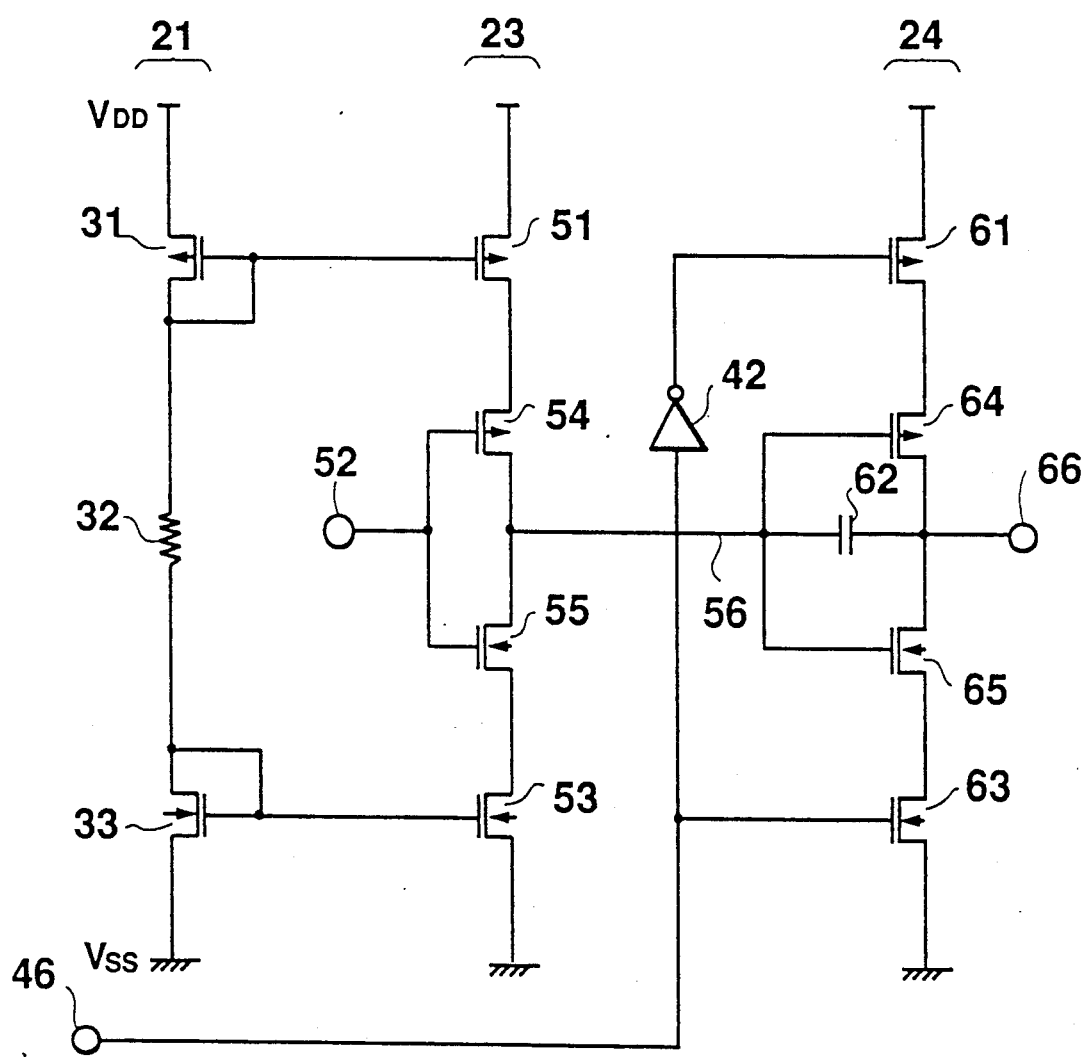
FIGS. 11 to 16 are circuit diagrams of second to seventh embodiments of an output buffer circuit according to the present invention.

In FIG. 11, there is shown the second embodiment of the output buffer circuit according to the present invention, having a similar construction to that of the first embodiment shown in FIG. 8.

In this embodiment, the HZ set circuit 22 is simplified as compared with that of the first embodiment, and comprises an inverter 42 and a control terminal 46. Hence, the gate electrode of a P-channel MOSFET 31 in the reference voltage generation circuit 21 is connected to only the gate electrode of a P-channel MOSFET 51 of the input stage circuit 23, and the gate electrode of an N-channel MOSFET 33 in the reference voltage generation circuit 21 is connected to only the gate electrode of an N-channel MOSFET 53 of the input stage circuit 23. A control signal input to the control terminal 46 is fed to the gate electrode of an N-channel MOSFET 63 in the output stage circuit 24. The control signal is inverted in the inverter 42, and an inverted control signal is sent to the gate electrode of a P-channel MOSFET 61 in the output stage circuit 24.

In this embodiment, a straight linear middle portion between rising or falling start and end portions of a leading or trailing edge of an output signal is somewhat narrowed. In this case, the operation is carried out in the same manner as that of the first embodiment described above, and the same results and advantages as those of the first embodiment can be obtained.

Figure 12:
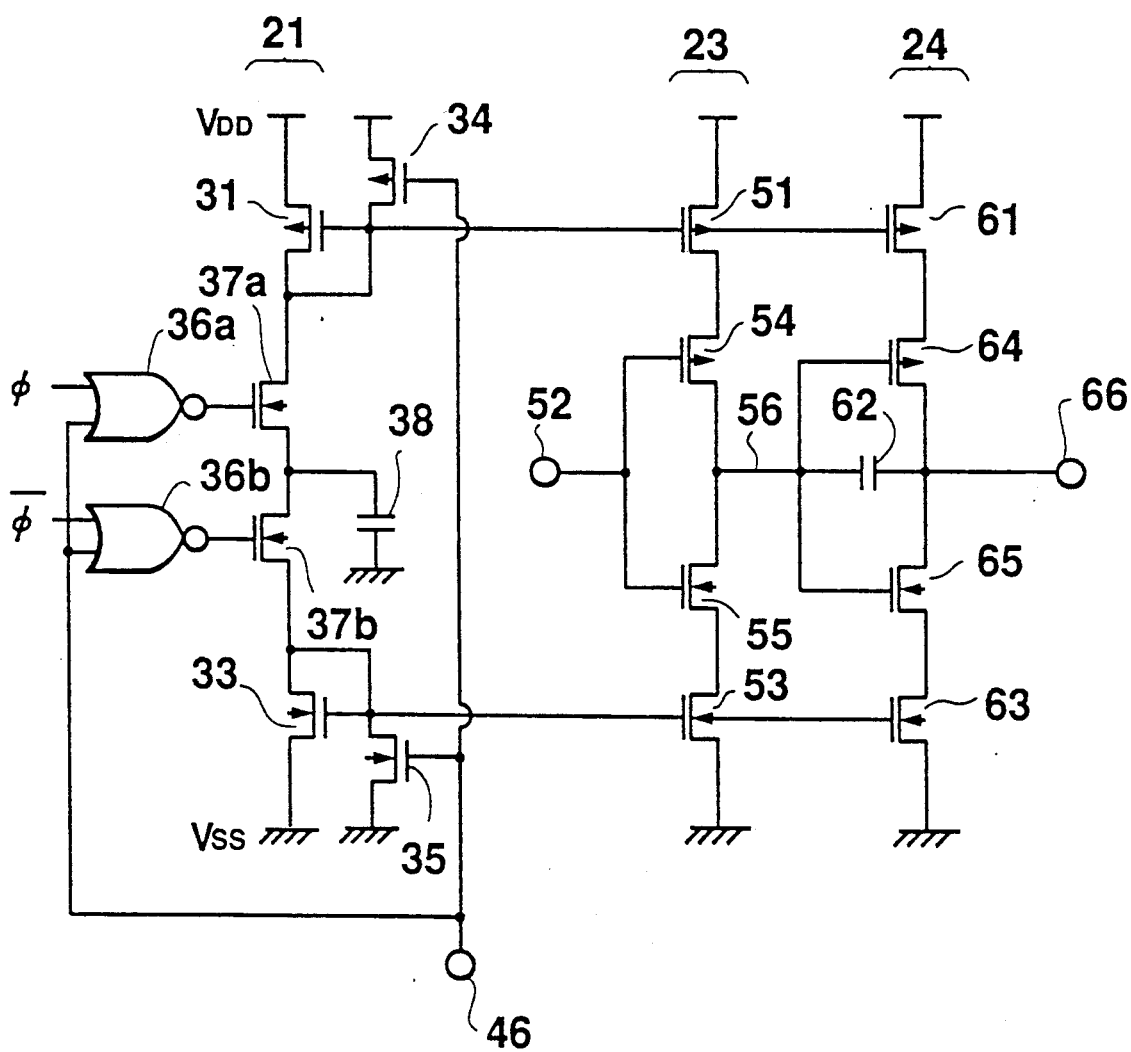

In FIG. 12, there is shown the third embodiment of the output buffer circuit according to the present invention, having a similar construction to that of the first embodiment shown in FIG. 8.

In this embodiment, the resistor 12 of the reference voltage generation circuit 21 of the first embodiment is replaced by a switched capacitor device which comprises two N-channel MOSFETs 37a and 37b connected in series, and a capacitor 38 linked to the connection of the two MOSFETs 37a and 37b. A pair of clock pulses $\phi$ and $\overline{\phi}$ having a frequency f is fed to one of the input terminals of NOR gates 36a and 36b, respectively, and the output signals of the NOR gates 36a and 36b are output to the gate electrodes of the MOSFETs 37a and 37b, respectively. In this case, the inverter 42 and the first and second transfer gates 44 and 45 in the first embodiment are omitted, and a pair of P-channel and N-channel MOSFETs 34 and 35 is provided instead of the MOSFETs 41 and 43 in the first embodiment. Thus, the drain electrodes of the MOSFETs 34 and 35 are connected to the gate electrodes of the P-channel and N-channel MOSFETs 31 and 33, respectively. A control signal fed to a control terminal 46 is sent to the gates of the MOSFETs 34 and 35 and to the other input terminals of the NOR gate 36a. By feeding the clock pulses $\phi$ and $\overline{\phi}$ to the MOSFETs 37a and 37b via the NOR gates 36a and 36b, an equivalent resister $R_S$ is generated.

The equivalent resister $R_S$ is represented by the following equation, $$R_S = \frac{1}{fC_1} \tag{25}$$

wherein $C_1$ is a capacity of the capacitor 38. Hence, the inclination $\Delta V/\Delta t$ of the output waveform is obtained in the following formula.

$$\frac{\Delta V}{\Delta t} = \frac{C_1}{fC_2} \tag{26}$$

In this case, the frequency of the clock pulses for determining the inclination of the leading and trailing edges of the output waveform can be obtained from an accurate quartz oscillator or ceramic, and the capacity ratio $C_1/C_2$ can be accurately realized on a semiconductor substrate. Accordingly, in this embodiment, the control of the rising or falling inclination $\Delta V/\Delta t$ of the leading and trailing edges of the output waveform can be performed with a high accuracy.

Figure 13:
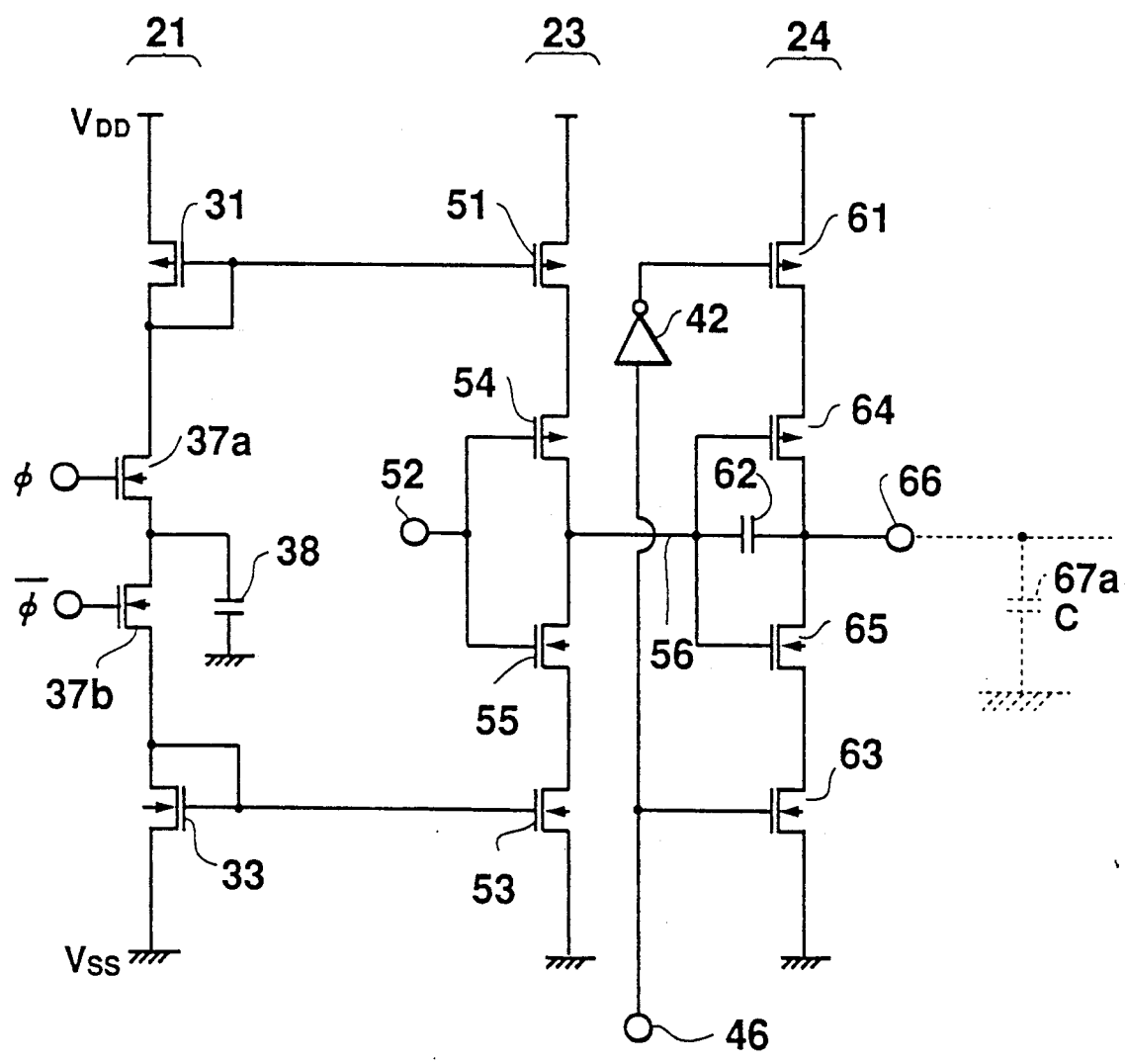

In FIG. 13, there is shown the fourth embodiment of the output buffer circuit according to the present invention, having the same construction as that of the second embodiment shown in FIG. 11, except that the resistor 12 of the reference voltage generation circuit 21 of the second embodiment is replaced by a switched capacitor device which comprises two N-channel MOSFETs 37a and 37b connected in series, and a capacitor 38 linked to the connection of the two MOSFETs 37a and 37b in the same manner as those of the third embodiment shown in FIG. 12. The clock pulses $\phi$ and $\overline{\phi}$ are fed to the gate electrodes of the MOSFETs 37a and 37b, respectively, to generate the equivalent resister $R_S$ in the same manner as that of the third embodiment. A capacitor 67a, indicated by a broken line in FIG. 13, is located after the output terminal 66 and represents a floating capacity in the load side connected thereto.

Figure 14:
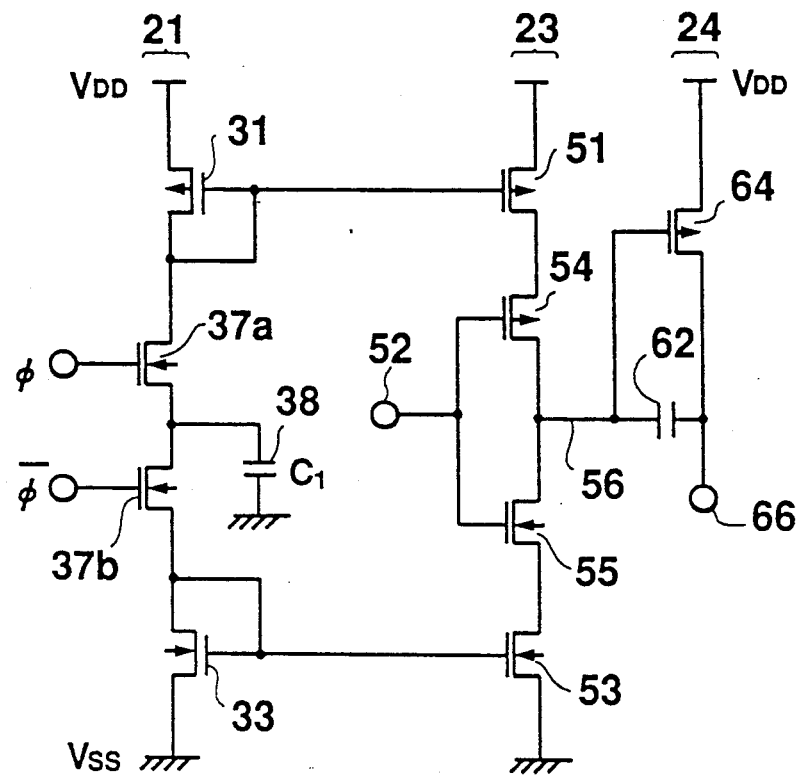

In FIG. 14, there is shown the fifth embodiment of the output buffer circuit according to the present invention, having a similar structure to that of the fourth embodiment shown in FIG. 13, except that no HZ set circuit 22 is provided, i.e., the inverter 42 and the control terminal 46 are omitted, and the P-channel MOSFET 61 connected to the positive power source $V_{DD}$ and the two N-channel MOSFETs 63 and 65 connected to the negative power source $V_{SS}$ in the fourth embodiment are omitted, i.e., the output stage circuit 24 includes only a P-channel MOSFET 64 connected to the positive power source $V_{DD}$, a Miller capacitor 62 connected between the gate and drain electrodes thereof and an output terminal 66 connected to the Miller capacitor 62 and the drain electrode of the MOSFET 64 to form an open drain output structure.

Figure 15:
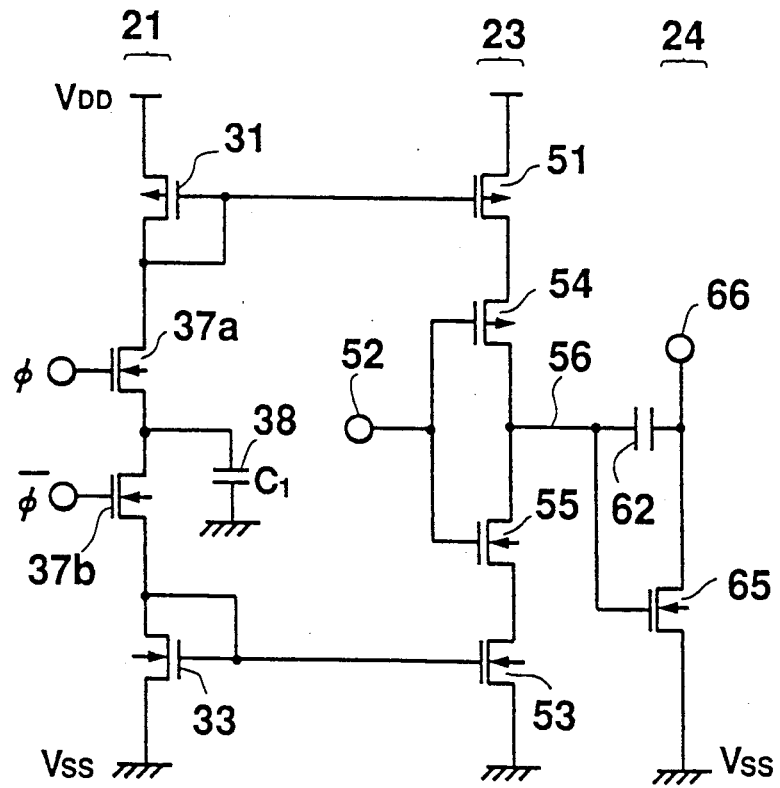

In FIG. 15, there is shown the sixth embodiment of the output buffer circuit according to the present invention, having the same structure as that of the fifth embodiment shown in FIG. 14, except that the two P-channel MOSFETs 61 and 64 connected to the positive power source $V_{DD}$ and the N-channel MOSFET 63 connected to the negative power source $V_{SS}$ in the fourth embodiment are omitted, and the output stage circuit 24 includes only an N-channel MOSFET 65 connected to the negative power source $V_{SS}$, a Miller capacitor 62 connected between the gate and drain electrodes thereof and an output terminal 66 connected to the Miller capacitor 62 and the drain electrode of the MOSFET 65 to form an open source output structure.

Figure 16:
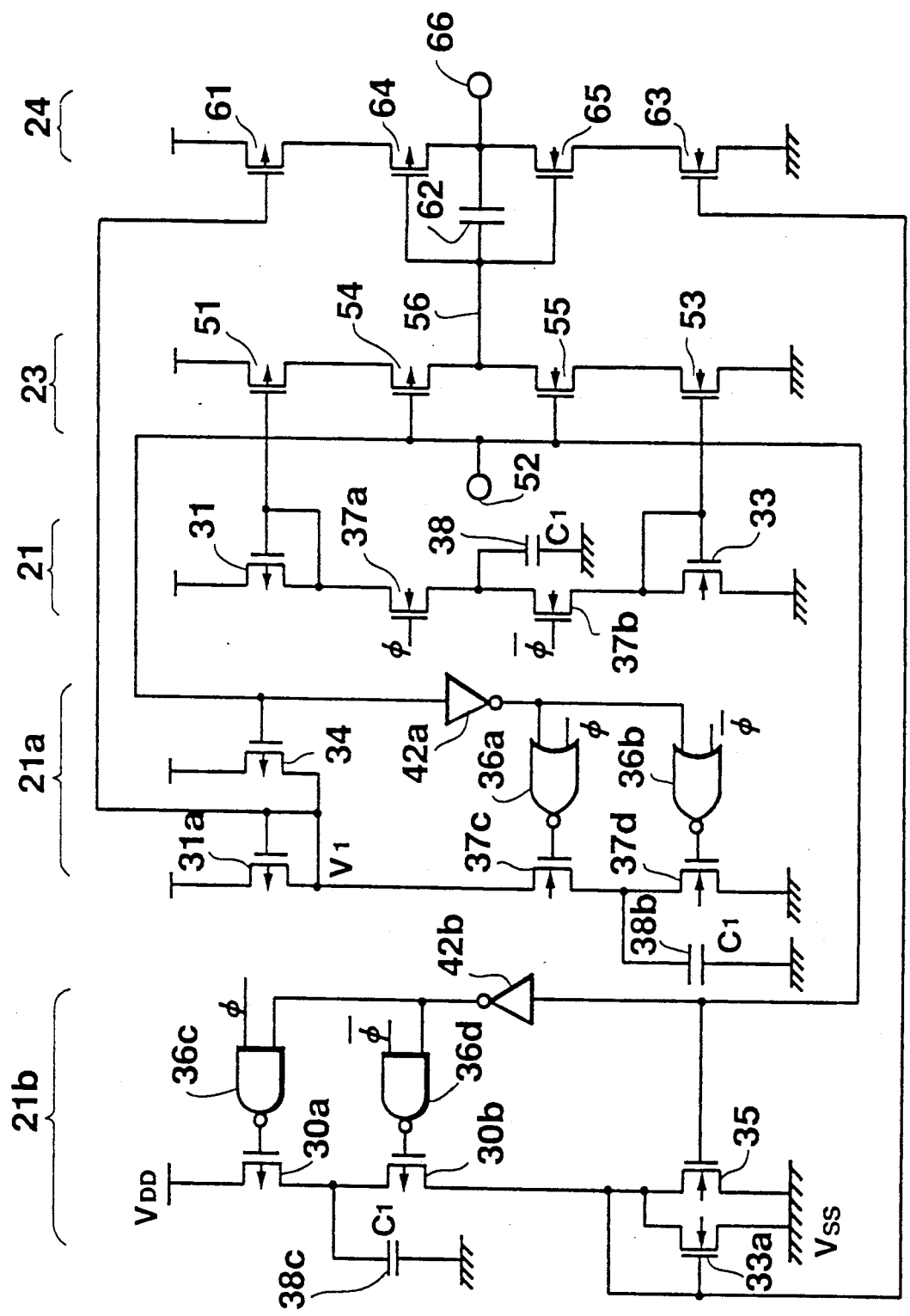

In FIG. 16, there is shown the seventh embodiment of the output buffer circuit according to the present invention, having a similar structure to that of the fourth embodiment, except for providing with first, second and third reference voltage generation circuits 21, 21a and 21b including a switched capacitor device.

The first reference voltage generation circuit 21 outputs voltages for driving current sources such as P-channel and N-channel MOSFETs 51 and 53 of the input stage circuit 23.

The second reference voltage generation circuit 21a generates the first reference voltage $V_1$ for driving a current source of a P-channel MOSFET 61 in the output stage circuit 24. In the second reference voltage generation circuit 21a, the source electrodes of two P-channel MOSFETs 31a and 34 are connected to the positive power source $V_{DD}$, and the gate and drain electrodes of the MOSFET 31a and the drain electrode of the MOSFET 34 are connected together to the gate electrode of the P-channel MOSFET 61 in the output stage circuit 24. To the drain electrodes of the MOSFETs 31a and 34, a switched capacitor device is connected, which comprises two N-channel MOSFETs 37c and 37d connected in series and a capacitor 38b linked to the connection of the MOSFETs 37c and 37d, and a pair of NOR gates 36a and 36b is connected to the MOSFETs 37c and 37d. The source electrode of the MOSFET 37d is connected to the negative power source $V_{SS}$.

A signal fed to an input terminal 52 in the input stage circuit 23 is input to the gate electrode of the MOSFET 34 and an inverter 42a, and an inverter input signal is sent from the inverter 42a to one input terminals of the NOR gates 36a and 36b. The clock pulses $\phi$ and $\overline{\phi}$ are fed to the other input terminals of the NOR gates 36a and 36b, respectively, and the output signals of the NOR gates 36a and 36b are fed to the gate electrodes of the MOSFETs 37c and 37d, respectively.

The third reference voltage generation circuit 21b generates the second reference voltage $V_2$ for driving a current source of an N-channel MOSFET 63 in the output stage circuit 24. In the second reference voltage generation circuit 21b, the source electrodes of two N-channel MOSFETs 33a and 35 are connected to the negative power source $V_{SS}$, and the gate and drain electrodes of the MOSFET 33a and the drain electrode of the MOSFET 35 are connected together to the gate electrode of the N-channel MOSFET 63 in the output stage circuit 24. To the drain electrodes of the MOSFETs 33a and 35, a switched capacitor device is connected, which comprises two P-channel MOSFETs 30a and 30b connected in series and a capacitor 38c linked to the connection of the MOSFETs 30a and 30b, and a pair of NAND gates 36c and 36d is connected to the MOSFETs 30a and 30b. The source electrode of the MOSFET 30a is connected to the positive power source $V_{DD}$.

The signal fed to the input terminal 52 in the input stage circuit 23 is input to the gate electrode of the MOSFET 35 and an inverter 42b, and an inverted input signal is sent from the inverter 42b to one input terminals of the NAND gates 36c and 36d. The clock pulses $\phi$ and $\overline{\phi}$ are fed to the other input terminals of the NAND gates 36c and 36d, respectively, and the output signals of the NAND gates 36c and 36d are fed to the gate electrodes of the MOSFETs 30a and 30b, respectively.

In this embodiment, as described above, the different reference voltage generation circuits 21a and 21b for generating the first and second reference voltages $V_1$ and $V_2$ for driving the positive and negative power source sides in the output stage circuit 24 are further provided, and by independently adjusting the capacities of the capacitors 38b and 38c of the switched capacitor devices, the inclinations of the leading and trailing edges of the output waveform can be independently determined.

Figure 17:
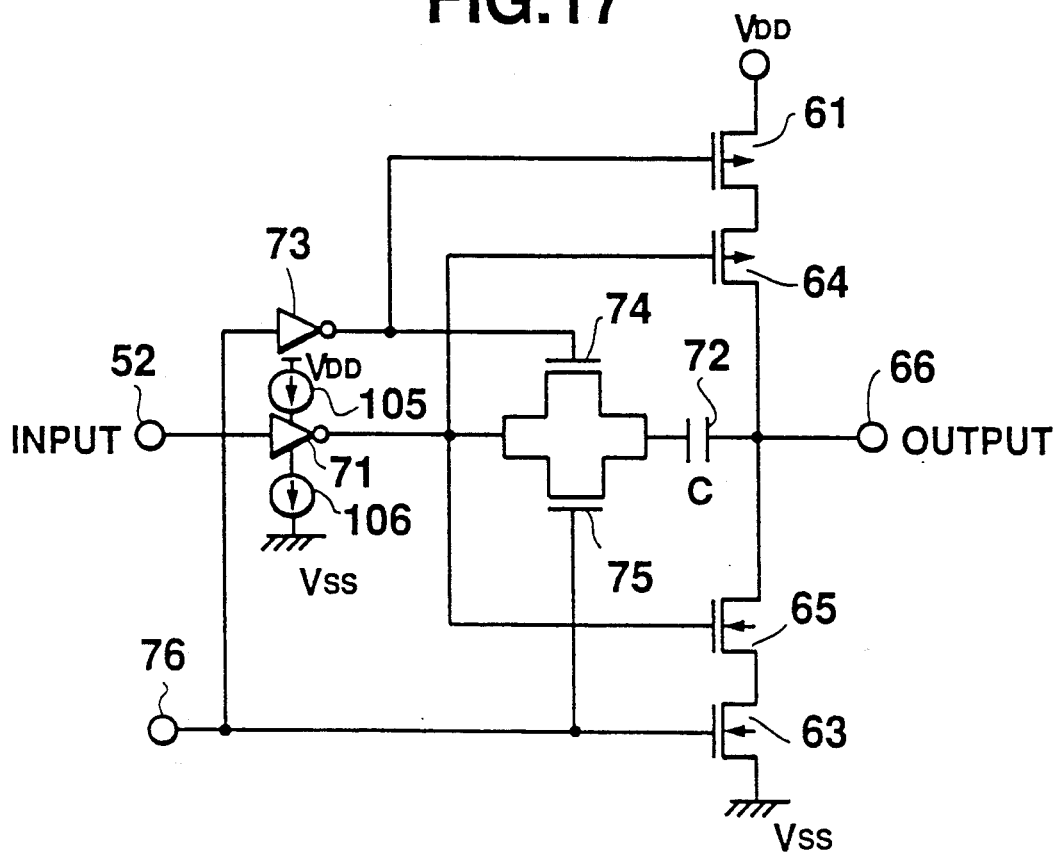
FIGS. 17 to 20 are circuit diagrams of the eighth to eleventh embodiments of an output buffer circuit according to the present invention.

In FIG. 17, there is shown the eighth embodiment of the output buffer circuit according to the present invention, having a similar structure to the second embodiment shown in FIG. 11.

In this embodiment, the output stage circuit 24 includes two P-channel MOSFETs 61 and 64, two N-channel MOSFETs 65 and 63, a Miller capacitor 72 and an output terminal 66, and the four MOSFETs 61, 64, 65 and 63 are arranged in series between the positive and negative power sources $V_{DD}$ and $V_{SS}$. The P-channel MOSFET 64 and the N-channel MOSFET 65 constitute an inverter. A pair of P-channel and N-channel MOSFETs 74 and 75 constituting an analog switch is arranged between the coupled gate electrodes of the MOSFETs 64 and 65 and one terminal of the Miller capacitor 72, and the other terminal of the Miller capacitor 72 and the coupled drain electrodes of the MOSFETs 64 and 65 are connected together to the output terminal 66.

A signal fed to an input terminal 52 is sent to the gate electrodes of the MOSFETs 64 and 65 through an inverter 71. An enable signal input to a control terminal 76 is sent to the gate electrodes of the N-channel MOSFETs 63 and 75 and an inverter 73. In the inverter 73, the enable signal is inverted, and an inverted enable signal is fed to the gate electrodes of the P-channel MOSFETs 61 and 74. In this embodiment, the analog switch composed of the MOSFETs 74 and 75 and the MOSFETs 61 and 63 in the output stage circuit are driven to be opened or closed by the enable signal input to the control terminal 76.

In this case, when the input signal fed to the input terminal 52 is input to the output stage circuit 24 in order to obtain the output signal from the output terminal 66, the control terminal 76 is held to the low level to close the MOSFETs 61 and 63 and the analog switch composed of the MOSFETs 74 and 75.

Now, when, in order to restrict the output of the input signal of the input terminal 52 to the output stage circuit 24, the control terminal 76 is held to the high level to open the MOSFETs 61 and 63 and the analog switch composed of the MOSFETs 74 and 75, the path between the input and output terminals of the inverter composed of the MOSFETs 64 and 65 is electrically insulated, and the output terminal 66 becomes the high impedance condition, thereby preventing the leakage of the AC components of the input signal to the output terminal 66, the input signal being fed from the input terminal 52 to the gate electrodes of the MOSFETs 64 and 65 via the inverter 71.

In this embodiment, a pair of current sources 105 and 106 may be also connected to the inverter 71. The details of the operation, functions and effects of the current sources 105 and 106 is the same as those described hereinafter in connection with FIGS. 23 to 26 and, thus, can be omitted here.

Figure 18:
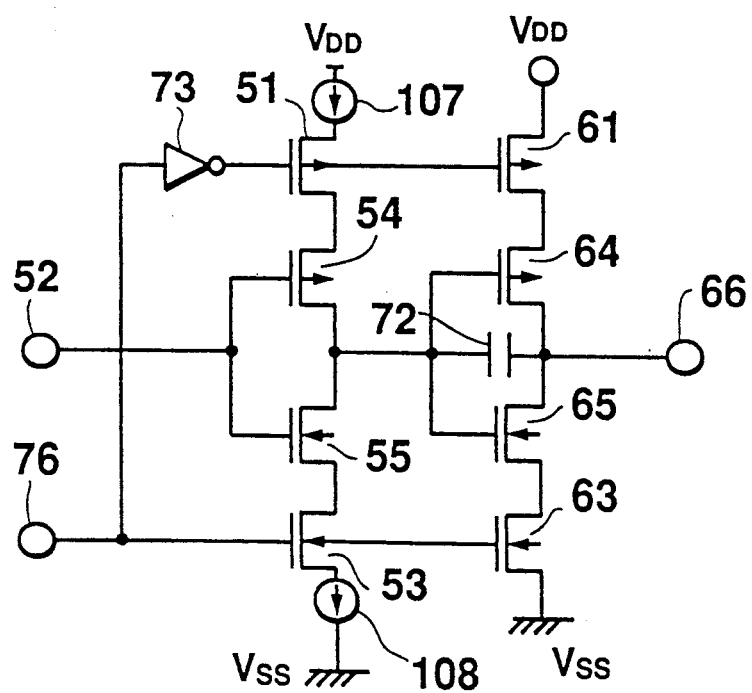

In FIG. 18, there is shown ninth embodiment of the output buffer circuit according to the present invention, having a similar construction to the eighth embodiment shown in FIG. 17.

In this embodiment, the analog switch portion of the eighth embodiment is replaced by a three-state circuit which comprises two P-channel MOSFETs 51 and 54 and two N-channel MOSFETs 55 and 53, which are connected in series between the positive and negative power sources $V_{DD}$ and $V_{SS}$. An enable signal fed to a control terminal 76 is sent to the gate electrode of the N-channel MOSFET 53 and an inverter 73, and an inverted enable signal is fed to the gate electrode 51 of the P-channel MOSFET 51.

In this case, by holding the enable signal to the high level in the same manner as the eighth embodiment, the MOSFETs 51 and 53 are opened, and the three-state circuit becomes the high impedance condition. Hence, the path between the input and output terminals of the inverter composed of the MOSFETs 64 and 65 is electrically insulated to prevent the leakage of the AC components of the input signal to the output terminal 66 in the same manner as described above.

In this embodiment, a pair of current sources 107 and 108 may be also inserted in the source sides of the MOSFETs 51 and 53. The detail of the current sources 107 and 108 is the same as those described hereinafter in connection with FIGS. 23 to 26 and thus can be omitted here.

Figure 19:
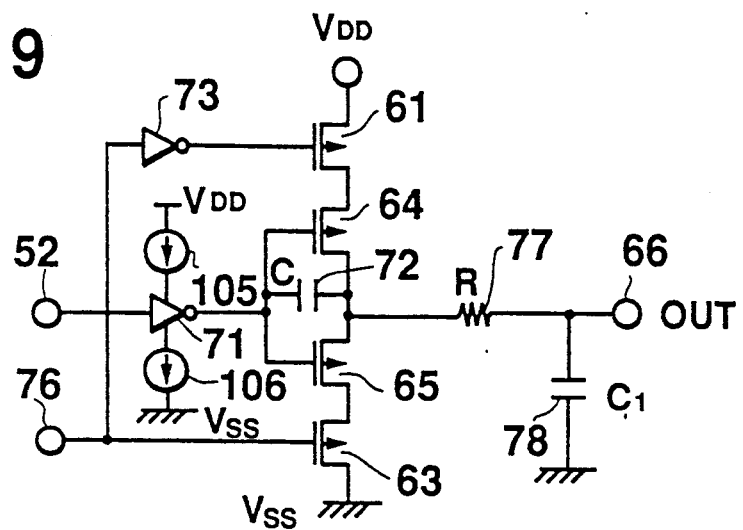

In FIG. 19, there is shown the tenth embodiment of the output buffer circuit according to the present invention, having a similar structure to the eighth embodiment described above.

In this case, a low pass filter comprising a combination of a resister 77 and a capacitor 78 having a capacity $C_1$, connected to the ground, is provided between the output side of the output stage circuit 24 and the output terminal 66. An input signal fed to the input terminal is sent to the gate electrodes of MOSFETs 64 and 65 through an inverter 71, and an enable signal input to a control terminal 76 is sent to the gate electrode of an N-channel MOSFET 63 and an inverter 73, and an inverted enable signal is fed to the gate signal of a P-channel MOSFET 61.

In this embodiment, when the MOSFETs 61 and 63 are opened by the high level enable signal to limit the output, the AC component of the input signal is leaked through a Miller capacitor 72 having a capacity C toward the output terminal 66, the capacity dividing of the leaked AC component is effected by the capacitor 78 and the Miller capacitor 72 to reduce the component to a reduced value $C/(C+C_1)$. Usually, the capacity C of the Miller capacitor 72 is determined to several to several tens pF, and, when the capacity $C_1$ of the capacitor 78 is selected to several hundreds pF, the leaked signal can be reduced to a negligible level. Further, the low pass filter composed of the capacitor 78 and the resister 77 located between the Miller capacitor 72 and the capacitor 78 prevents an electromagnetic wave noise from transferring to the output terminal 66.

In this embodiment, a pair of current sources 105 and 106 may be also connected to the inverter 71. The details of the operation, functions and effects of the current sources 105 and 106 is the same as those described hereinafter in connection with FIGS. 23 to 26 and thus can be omitted here.

Figure 20:
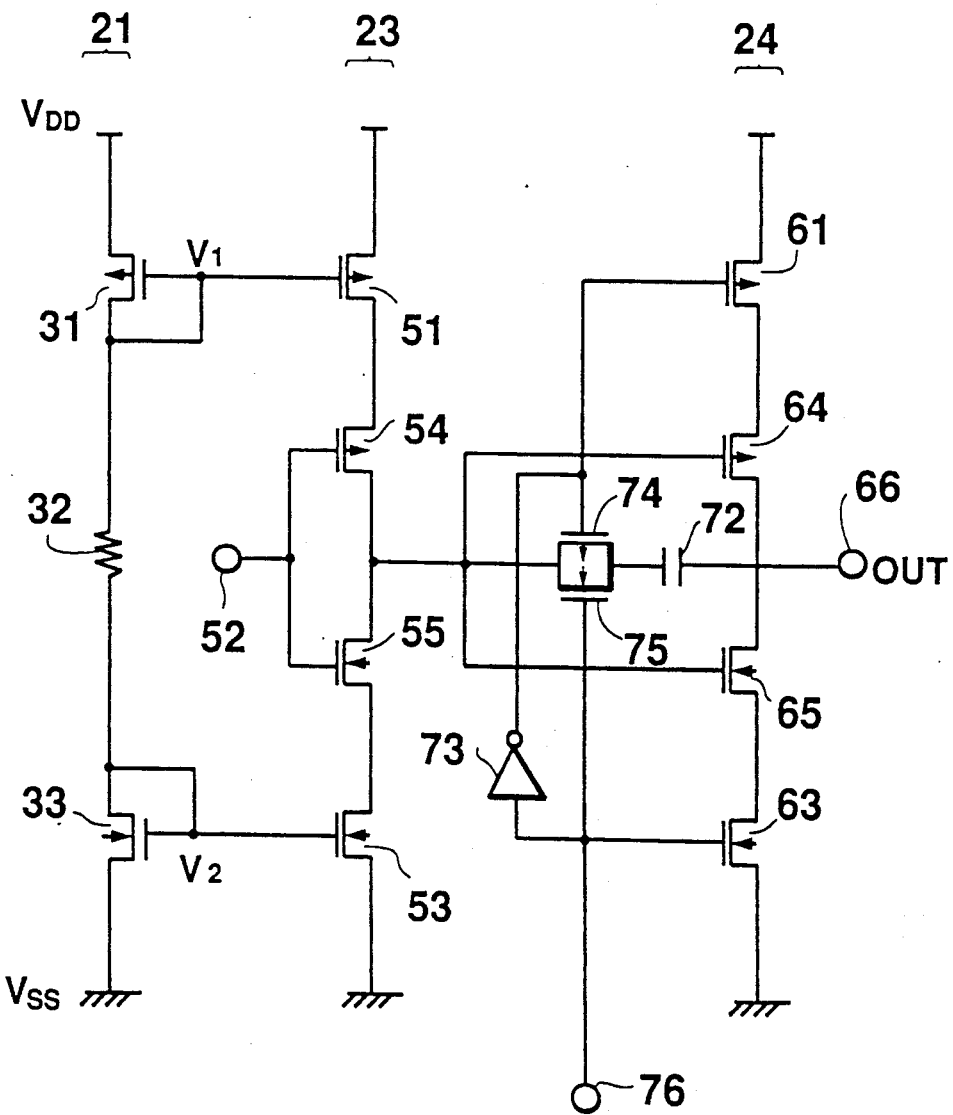

In FIG. 20, there is shown the eleventh embodiment of the output buffer circuit according to the present invention, having a similar structure to the second embodiment shown in FIG. 11.

In this embodiment, an analog switch composed of a pair of P-channel and N-channel MOSFETs 74 and 75 is arranged between the coupled gate electrodes of the MOSFETs 64 and 65 and a Miller capacitor 72 in the same manner as that of the eighth embodiment shown in FIG. 17, with the result of the same effects and advantages as those of the eighth embodiment.

Figure 21:
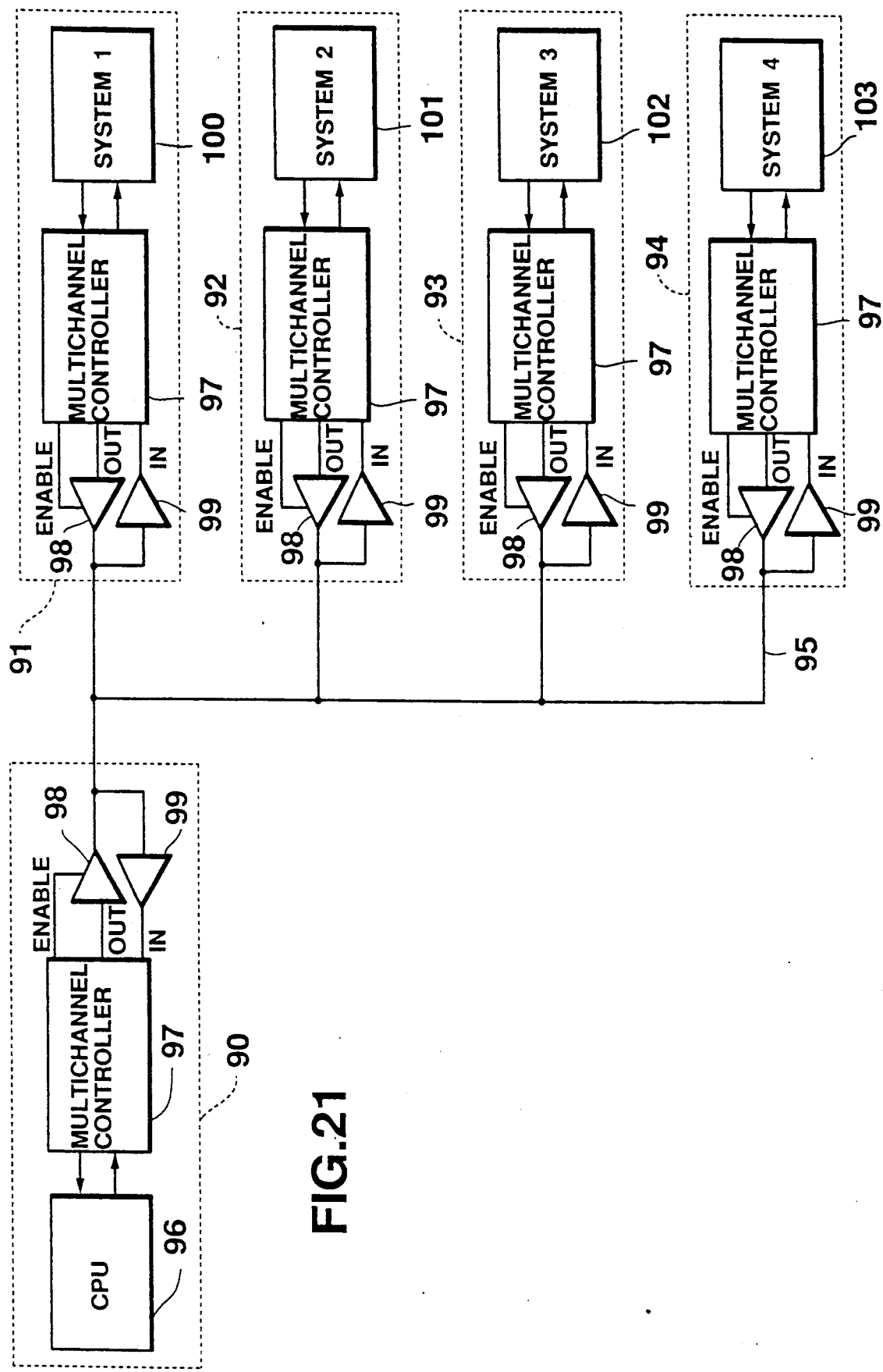
FIG. 21 is a block diagram of a serial data line for multichannel communication in a vehicle, to which an output buffer circuit according to the present invention is applied.

In FIG. 21, there is shown a serial data line for a multichannel communication in a vehicle, to which output buffer circuits according to the present invention is applied.

In this case, a parent or master station 90 is connected to child or slave stations 91, 92, 93 and 94 via a serial data line 95 so that data can be mutually communicated between the master station 90 and the slave stations 91 to 94. The master station 90 includes a CPU (central processing unit) 96, a multichannel controller 97, an output buffer circuit 98 according to the present invention and an input circuit 99. The slave station 91, 92, 93 or 94 includes a multichannel controller 97, an output buffer circuit 98 of the present invention, an input circuit 99 and a system 100, 101, 102 or 103 to be controlled. A variety of control actuators, sensors, motors, operational switches and the like provided in the vehicle can be applied as the system 100 to 103, and the harness mounted to various portions in the vehicle can be used as the serial data line 95.

If the serial data line 95 is mounted near an antenna for a radio receiver in a vehicle, by providing the output buffer circuit of the present invention, even when a signal of approximately several tens of kbs is transmitted to the serial data line 95, electromagnetic wave noise can be prevented from mixing in the radio receiver. At the same time, the useless signals leaked from the slave stations not for transmitting the signal to the data line 95 can be effectively prevented.

Figure 22:
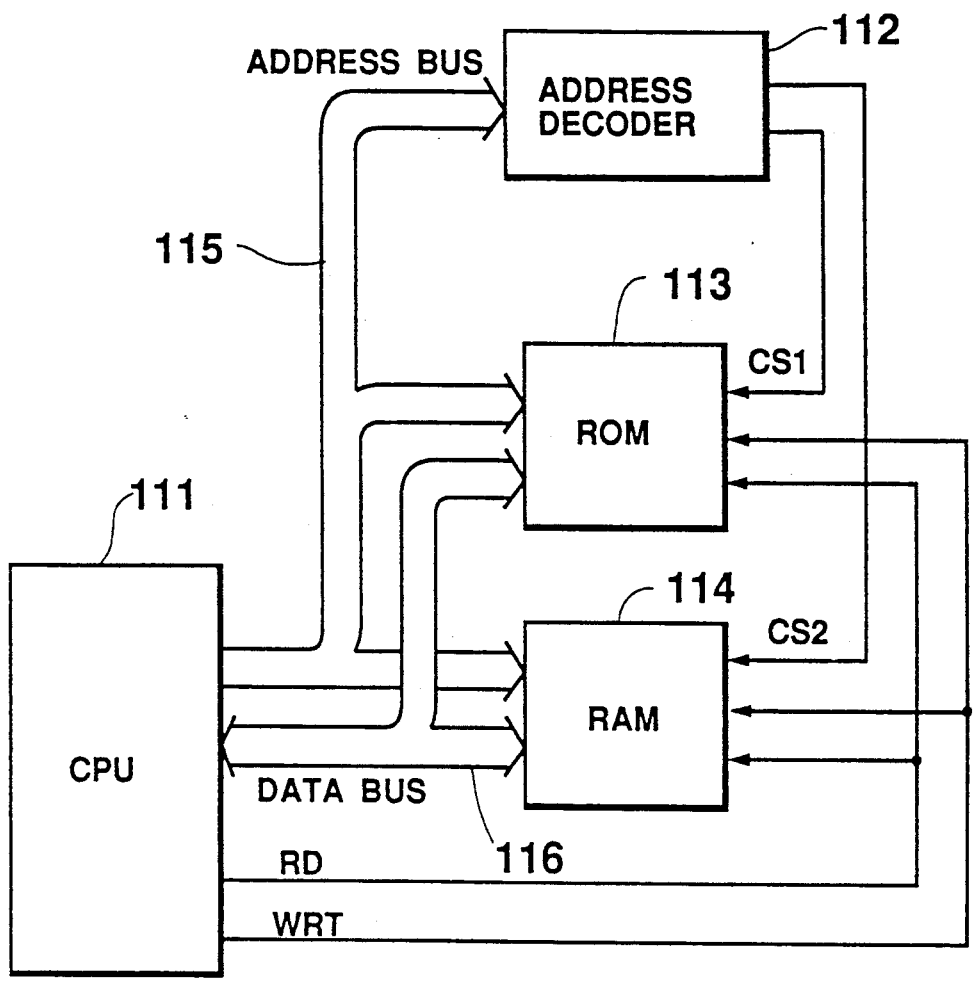
Figure 22:
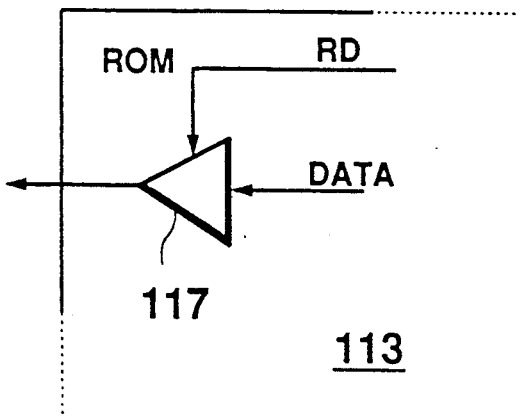
Figure 22:
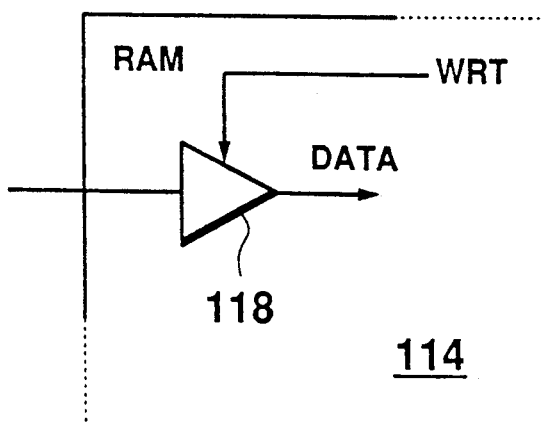

In FIG. 22, there is shown a data transfer circuit of a bus line in a PC board, including output buffer circuits according to the present invention.

In FIG. 22a, the data transfer circuit includes a CPU 111, an address decoder 112, a ROM 113, a RAM 114, an address bus 115 and a data bus 116. In this case, a data writing or reading in or out of the memories such as the ROM 113 and RAM 114 through the data bus 116 is controlled by the CPU 111 in the conventional manner.

In FIG. 22b, the ROM 113 includes an output buffer circuit 117 according to the present invention, and the data is read out of the ROM 113 via the output buffer circuit 117 by an access thereof by a reading signal RD sent from the CPU 111. When the output buffer circuit 117 is not driven by the reading signal RD for reading the data out of the ROM 113, the ROM 113 is always separated from the data bus 116, and hence the leakage of the useless data from the ROM 113 to the data bus 116 can be effectively prevented.

In FIG. 22c, the RAM 114 includes an output buffer circuit 118 according to the present invention, and the data is written in the RAM 114 via the output buffer circuit 118 by an access thereof by a writing signal WRT output from the CPU 111. When the output buffer circuit 118 is not driven by the writing signal WRT for writing the data into the RAM 114, the RAM 114 is always isolated from the data bus 116, and thus the leakage of the useless data from the data bus 116 to the RAM 114 can be effectively prevented.

In the embodiments described above, the output buffer circuit is provided with a switching circuit for performing an open-close control for the path between the input and output of the inverter by sending a control signal, and hence a leakage of useless AC signal components to the output terminal through a Miller capacitor when no signal is transmitted between the input and output sides of the inverter.

In FIG. 23, there is shown the twelfth embodiment of the output buffer circuit according to the present invention, having a similar construction to the eighth embodiment shown in FIG. 17.

In this embodiment, a pair of P-channel and N-channel MOSFETs 64 and 65 constituting an inverter is arranged in series between the positive and negative power sources $V_{DD}$ and $V_{SS}$, and a Miller capacitor 72 is connected between the coupled gate electrodes of the MOSFETs 64 and 65 and the coupled drain electrodes thereof. Another pair of P-channel and N-channel MOSFETs 81 and 82 is connected in series to each other, and the coupled drain electrodes of the MOSFETs 81 and 82 are connected to the coupled gate electrodes of the MOSFETs 64 and 65. The source electrode of the MOSFET 81 is connected to the positive power source $V_{DD}$ through a first current source 83, and the source electrode of the MOSFET 82 is connected to the negative power source $V_{DD}$ through a second current source 84.

A signal fed to an input terminal 52 is sent to the coupled gate electrodes of the MOSFETs 64 and 65 through an inverter 71 and a CMOS transfer gate composed of P-channel and N-channel MOSFETs 74 and 75 inserted between the gate electrodes of the MOSFETs 64 and 65 and the inverter 71, and an inverted output signal is output from the coupled drain electrodes of the MOSFETs 64 and 65 to an output terminal 66. An actuating signal input to a control terminal 76 is fed to the gate electrodes of the MOSFETs 75 and 82 and an inverter 73, and an inverted actuating signal is sent from the inverter 73 to the gate electrodes of the MOSFETs 74 and 81. In this case, the P-channel and N-channel MOSFETs 81 and 82, the CMOS transfer gate MOSFETs 74 and 75 and the current sources 83 and 84 constitute a high impedance set circuit.

There are shown in FIG. 25 pulse signals such as the input signal, the actuating signal and the output signal flowing in FIG. 23. When the actuating signal input to the control terminal 76, to be fed to the high impedance set circuit, is the low level, the transfer gate is ON, and the MOSFETs 81 and 82 are OFF. Hence, the input signal given to the input terminal 52 is somewhat moderated in its waveform and is then output to the output terminal 66, as shown in FIG. 25.

Then, when the actuating signal is changed to the high level, the transfer gate is changed to OFF to electrically separate the path between the input and output terminals 52 and 66, and the MOSFETs 81 and 83 are changed to ON. As a result, the current supply from the current sources 83 and 84 to the MOSFETs 64 and 65 is started. As the currents are passed from the current sources 83 and 84 to the MOSFETs 64 and 65, the voltages supplied to the gate electrodes of the MOSFET 64 and 65 are gradually increased or decreased, and the MOSFETs 64 and 65 are also gradually turned to OFF. The turning speed from ON to OFF is determined depending on the current values of the current sources 83 and 84, the capacity of the Miller capacitor 72, other gate capacities and the like. That is, by properly adjusting the current values of the current sources 83 and 84 and the capacity of the Miller capacitor 72, the changing time of the high impedance set circuit from the low to high impedance can be adjusted, and the falling speed of the output waveform from the high to low level at the output terminal 66 during the changing time from the low to high impedance can be moderated. As a result, the hasty waveform change caused during the changing from the low to high impedance in the conventional manner can be prevented, and thus the noise generation due to this hasty waveform change can be prevented.

In FIG. 24, there is shown thirteenth embodiment of the output buffer circuit according to the present invention, having a similar structure to the twelfth embodiment shown in FIG. 24.

In this embodiment, two P-channel MOSFETs 61 and 64 and two N-channel MOSFETs 65 and 63 are arranged between the positive and negative power sources $V_{DD}$ and $V_{SS}$ in the output stage circuit 24 in the same manner as described above. An actuating signal input to a control terminal 76 is fed to an inverter 73 and the gate electrode of the N-channel MOSFET 63 through an inverter 86, and an inverted actuating signal is sent from the inverter 73 to the gate electrode of the P-channel MOSFET 61 through an inverter 85. First and second current sources 126 and 136 and third and fourth current sources 146 and 156 are connected to the inverters 85 and 86, respectively, in the same manner as the one of the twelfth embodiment described above. In this case, the MOSFETs 61 and 63 and the current sources 126, 136, 146 and 156 constitute a high impedance set circuit which is controlled by the actuating signal.

In this case, in the same manner as the twelfth embodiment described above, when the actuating signal input to the control terminal 76 and to be fed to the high impedance set circuit is the low level, the MOSFET 61 and 63 are ON, and the output stage circuit including the MOSFETs 64 and 65 becomes active. Hence, the input signal given to the input terminal 52 is somewhat moderated its waveform and is then output to the output terminal 66.

When the actuating signal is turned from the low to high level to obtain the high impedance condition, the output of the inverter 85 is gradually raised to the high level depending on the current value fed from the current source 126, and the voltage applied to the gate electrode of the MOSFET 61 is gradually increased. Hence, the MOSFET 64 is gradually turned to OFF. In the same manner as above, the output of the inverter 86 is gradually fallen to the low level depending on the current value fed from the current source 156, and the voltage applied to the gate electrode of the MOSFET 63 is gradually decreased. Thus, the MOSFET 65 is gradually turned to OFF. The changing speed from the ON to OFF is determined by the current values of the current sources 126 and 156 and the gate capacities of the MOSFETs 61 and 63.

That is, by properly adjusting the current values of the current sources 126 and 156 and the gate capacities of the MOSFETs 61 and 63, the changing time of the high impedance set circuit from the low to high impedance can be adjusted, and, when the output waveform at the output terminal 66 is the high level during the changing time from the low to high impedance, the falling speed of the output waveform from the high to low level can be moderated. As a result, the hasty waveform change caused during the changing from the low to high impedance in the conventional manner can be prevented, and thus the noise generation due to this hasty waveform change can be prevented.

Also, in the same manner as described above, when the actuating signal is changed from the high to low level, the outputs of the inverters 85 and 86 are gradually changed at the speed depending on the current values of the current sources 136 and 146, and thus the MOSFETs 64 and 65 are gradually changed to ON. When the output waveform at the output terminal 66 is the high level during the changing time from the high to low impedance, the hasty rising speed of the output waveform at the output terminal 66 can be prevented.

In this embodiment, when the moderation of the hasty waveform change during the changing of the impedance from the high to low value is not required, the current sources 136 and 146 connected to the inverters 85 and 86, respectively, can be omitted.

In FIG. 26, there is shown the fourteenth embodiment of the output buffer circuit according to the present invention, having a similar construction to the twelfth and thirteenth embodiments shown in FIGS. 23 and 34.

In this embodiment, a CMOS transfer gate composed of P-channel and N-channel MOSFETs 74 and 75 as a part of a high impedance set circuit is inserted between an inverter 71 and a Miller capacity 72. An inverter 73 is connected between a control terminal 76 and the gate electrode of the MOSFET 74, and another inverter 87 is arranged between the control terminal 76 and an inverter 86. In this case, the operation and effects are the same as the twelfth and thirteenth embodiments described above, and thus the description of these can be omitted.

In the embodiments described above, in the case that two systems are connected using the output buffer circuits of the present invention to carry out a mutual communication between the two systems in a vehicle, even when pulldown resisters or pullup resisters connected to the ground are provided in order to make sure of the contact between connectors, no noise problem for AM and FM radio receivers is caused.

What is claimed is:

1. An output buffer circuit, comprising:
   a pair of current sources connected to positive and negative power sources;
   a first inverter having input and output terminals, coupled between the positive and negative power sources;
   a second inverter having input and output terminals, coupled between the current sources and connected to the output terminal of the first inverter, the second inverter including at least one of P-channel and N-channel MOSFETs; and
   a capacitor connected between the input and output terminals of the second inverter.

2. The circuit of claim 1, further comprising a pair of second and third current sources, connected between the first inverter and the positive and negative power sources, respectively.

3. The circuit of claim 2, further comprising a first reference voltage generation circuit for outputting voltages for driving the current sources.

4. The circuit of claim 3, further comprising second and third reference voltage generation circuits for outputting second and third voltages for driving the second and third current sources.

5. The circuit of claim 1, further comprising means for activating and deactivating the current sources.

6. The circuit of claim 2, further comprising means for activating and deactivating the second and third current sources.

7. The circuit of claim 1, further comprising switching means for opening and closing a path between the input and output terminals of the second inverter.

8. The circuit of claim 1, further comprising:
   high impedance set means for activating the inverter when an actuating signal is input to the high impedance set means, and for changing the inverter from a low to high impedance condition when the actuating signal is not input to the high impedance set means; and
   current restriction means for moderating a current value variation of the actuating signal during the change between the low and high impedance conditions.

9. The circuit of claim 1, further comprising:
   switch means for opening and closing a path between the capacitor and a connection between the first and second inverters by using a control signal.

10. The circuit of claim 9, wherein the switching means is an transfer gate means inserted in an input side of the inverter.

11. The circuit of claim 8, wherein the high impedance set means includes a pair of MOSFETs connected to the inverter, and a current source means for driving the MOSFETs.

12. An output buffer circuit, comprising:
   a pair of current sources connected to positive and negative power sources;
   a first inverter having input and output terminals, coupled between the current sources;
   at least one of P-channel and N-channel MOSFETs, coupled to one of the positive and negative power sources, each MOSFET having gate and drain electrodes; and
   a capacitor connected between the gate and drain electrodes of the one of the MOSFETs.

* * * * *

REEXAMINATION CERTIFICATE (2138th)
United States Patent [19]

Ikeda et al.

[11] B1 5,051,625

[45] Certificate Issued Nov. 16, 1993

[54] OUTPUT BUFFER CIRCUITS FOR REDUCING NOISE

[75] Inventors: Hiroshi Ikeda, Yokohama; Takashi Kimura, Zushi; Norio Fujiki, Yokohama, all of Japan

[73] Assignee: Nissan Motor Co., Ltd., Yokohama, Japan

Reexamination Request:
No. 90/002,601, Feb. 14, 1992

Reexamination Certificate for:
Patent No.: 5,051,625
Issued: Sep. 24, 1991
Appl. No.: 427,337
Filed: Oct. 27, 1989

[30] Foreign Application Priority Data

Oct. 28, 1988 [JP] Japan ................... 63-272462
Mar. 6, 1989 [JP] Japan ..................... 1-53315
Apr. 7, 1989 [JP] Japan ..................... 1-88636

[51] Int. Cl.$^5$ ............. H03K 19/092; H03K 19/003; H03K 19/094; H03K 17/16
[52] U.S. Cl. .................. 307/475; 307/443; 307/451; 307/263; 307/473; 307/542

[58] Field of Search ............ 307/263, 268, 448, 451, 307/452, 453, 468, 469, 470, 481, 473, 475, 605

[56] References Cited

U.S. PATENT DOCUMENTS 4,791,326 12/1988 Vajdic et al. .................. 307/263
4,806,804 2/1989 O'Leary ........................ 307/605
4,899,071 2/1990 Morales ......................... 328/55

OTHER PUBLICATIONS

"Device Parameter Independent Delay Circuit" IBM Technical Disclosure Bulletin vol. 31, No. 1 Jun. 1988 pp. 21–23.

*Primary Examiner*—John Zazworsky

[57] ABSTRACT

An output buffer circuit, in which a pair of current sources is connected to positive and negative power sources, and a first inverter having input and output terminals, is arranged between the current sources, in which a second inverter having input and output terminals, is connected to the output terminal of the first inverter, the second inverter including at least one of P-channel and N-channel MOSFETs, and a capacitor is connected between the input and output terminals of the second inverter.

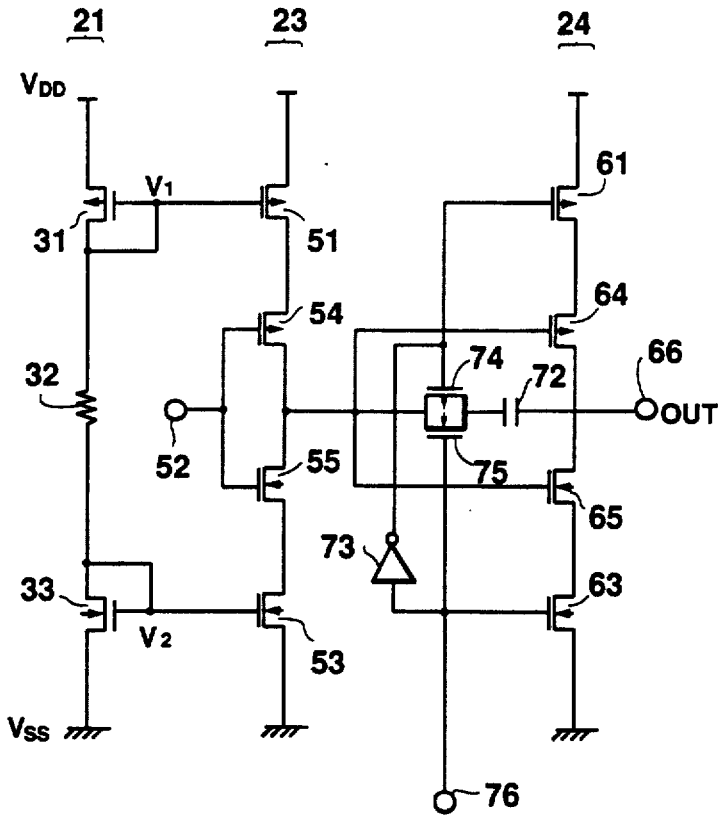

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Figure 1:
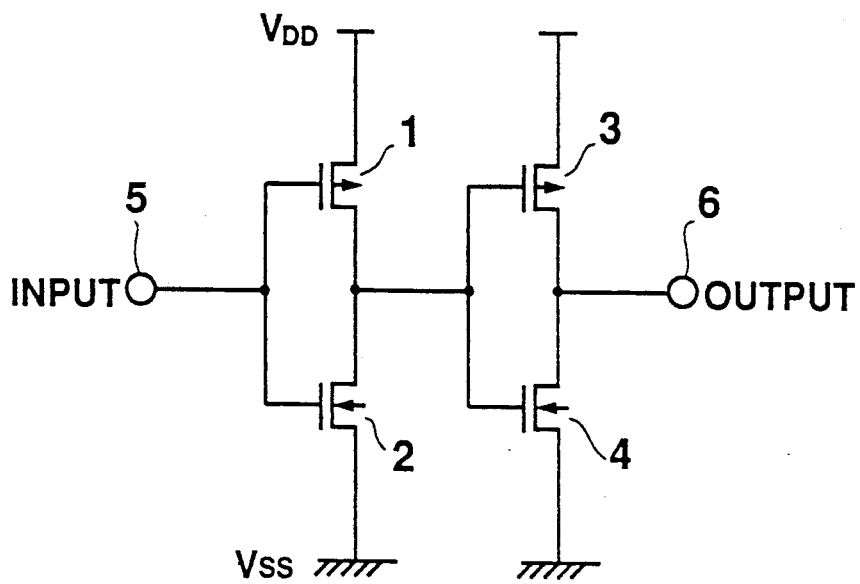
FIG. 1 is a circuit diagram of a conventional inverter.
Figure 2:
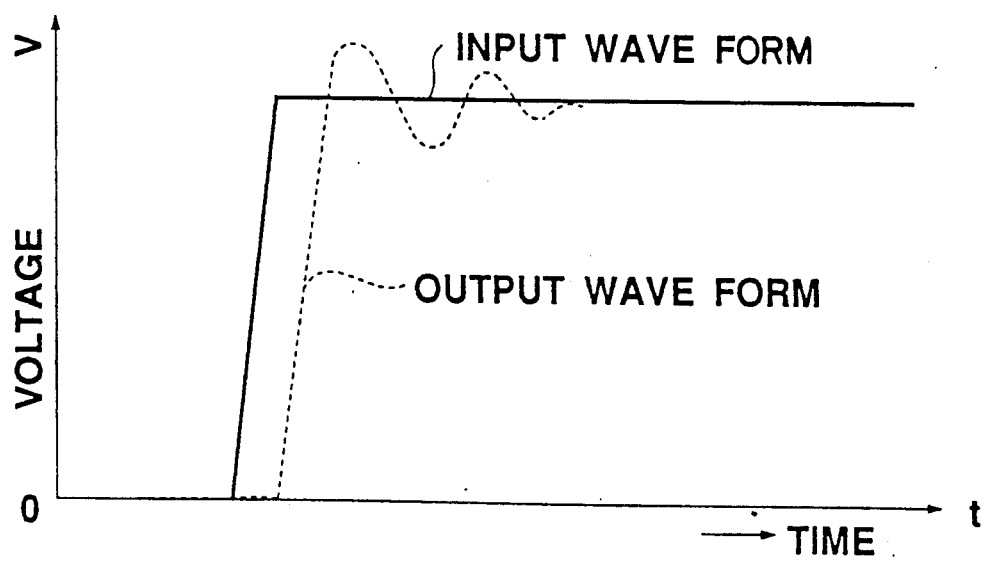
FIG. 2 is a schematic view of waveforms of input and output signals of the inverter shown in FIG. 1.
Figure 3:
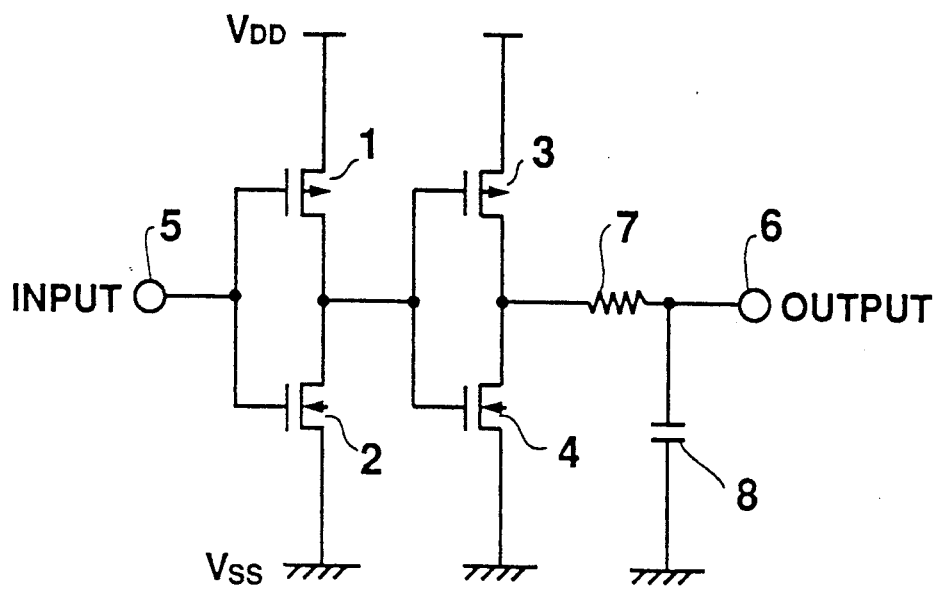
FIG. 3 is a circuit diagram of another conventional inverter.
Figure 4:
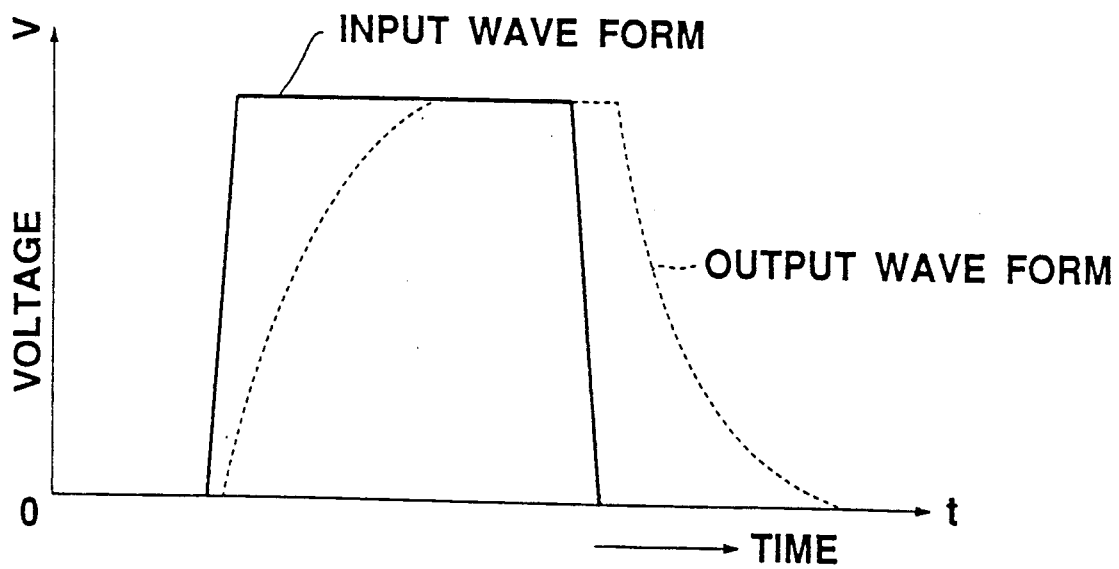
FIG. 4 is a schematic view of waveforms of input and output signals of the inverter shown in FIG. 3.
Figure 5:
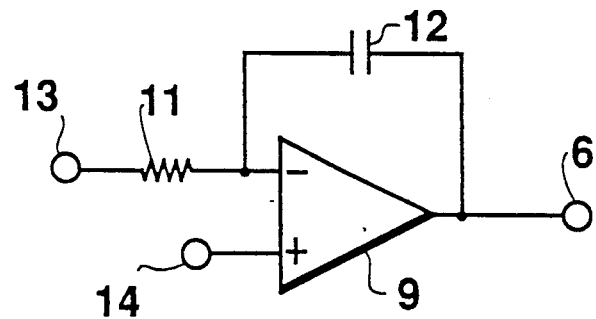
FIG. 5 is a circuit diagram of a further conventional inverter.

Column 1, lines 63–Column 2, line 4:
Firstly, an RC filter is provided in the output side of the rear converter of the output buffer circuit shown in FIG. 1. That is, as shown in FIG. 3, the RC filter comprising a combination of a resistor 7 and a capacitor 8 is arranged between the output side of the rear inverter and the output terminal [4] 6. In this case, the high-frequency noise component can be decreased or removed and the leading edge of the waveform of the output signal is moderated, as shown by a broken line in FIG. 4.

Figure 7:
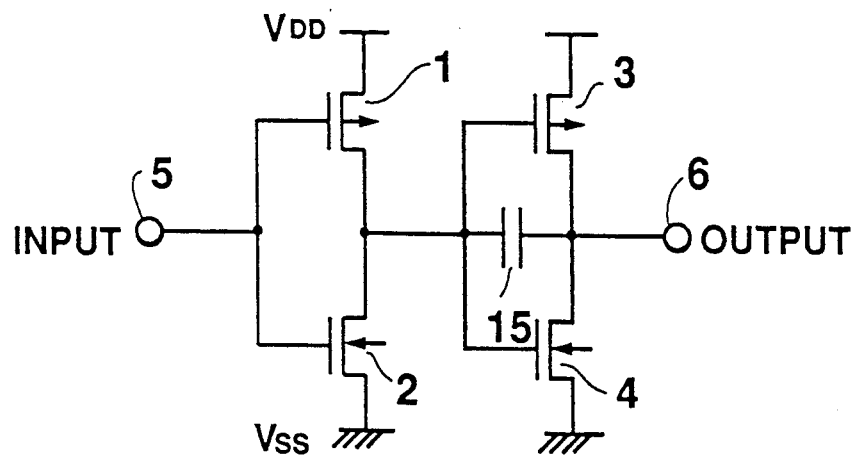
FIG. 7 is a circuit diagram of still another conventional inverter.

Column 2, lines 21–26:
Thirdly, as shown in FIG. 7, a Miller capacitor 15 is arranged between the input and output sides of the rear [converter] *inverter*, that is, between the gate electrodes and the drain electrodes of the third and fourth MOSFETs 3 and 4, as disclosed in Japanese Patent Laid-Open Specification No. 61-152125.

Figure 6:
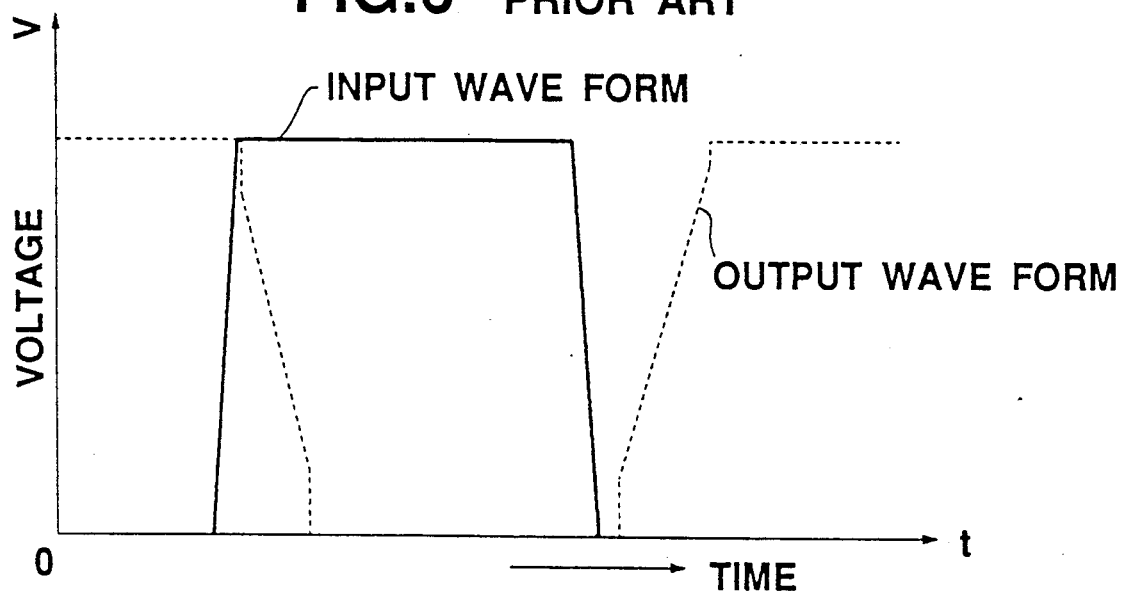
FIG. 6 is a schematic view of waveforms of input and output signals of the inverter shown in FIG. 5.

Column 2, lines 47–58:
In the second case, as shown in FIG. 6, although the inclinations at the rising and trailing of the signal can be exactly controlled, the rising and trailing start and end portions incline more steeply to cause the high-frequency noise component. In the third case, as shown in FIG. 7, since the Miller capacitor 15 is inserted between the input and output sides of the rear inverter, the AC component in the data signal input to the rear inverter always passes through the Miller capacitor 15 to the output terminal 6. As a result, the use of the pulse transfer circuit [providing] *provided* with the output buffer circuit may be restricted.

Column 6, lines 35–46:
Further, in the saturated region between these upper and lower unsaturated regions of the MOSFETs 64 and 65, by the action of the Miller capacitor 62, the voltage is changed at a certain inclination $\Delta V/\Delta t = V_2/C_2$, wherein $C_2$ is the capacity of the Miller capacitor, to obtain an output waveform, as shown by a broken line in FIG. 9. In this case, the gate capacity and the floating capacity of the wiring [capacitor] *capacitance* and the like are ignored. As to the falling or trailing edge of the high level signal fed to the input terminal 52, a moderating output waveform can be also obtained in the same manner as described above.

Column 6, lines 49–53:
In FIG. 10, there is shown an equivalent circuit of the output buffer circuit shown in FIG. 8 at the starting time of the leading *edge* of the high level signal. The input side voltage $V_1$ and an output side voltage $V_0$ are expressed by the following differential equations, $$(C_M + C_{gN}) \frac{dV_1}{dt} - C_M \frac{dv_0}{dt} = -i_2 \tag{7}$$

$$(C_0 + C_M) \frac{dV_0}{dt} - C_m \frac{dv_1}{dt} = i_P - i_N \tag{8}$$

wherein $C_M$ is the capacity of the Miller capacitor, $C_{gN}$ is the gate capacity of the N-channel MOSFET 65, $C_0$ is the load capacity after the output terminal 66, and $i_P$ and $i_N$ are currents flowing in the P-channel and N-channel MOSFETs 64 and 65, respectively. The currents $i_P$ and $i_N$ are expressed as follows:

$$i_P = \frac{\beta_p}{} (V_{DD} - V_1 - |V_{TP}|)^2 \tag{9}$$

$$i_N = \beta_N (V_1 - V_{TN}) V_0 \tag{10}$$

At the leading start time, the N-channel MOSFET 65 is in the unsaturated region, and thus equation (10) is applicable.

Column 8, lines 27–30:
That is, at a leading start time, a slant of $V_0$ is determined to zero, and then a high level signal starts [a] rising [or leading] in the waveform [of] *to produce* a curve represented by equation (20).

Column 8, lines 35–36:
Then, the middle [potion] *portion* of the rising or leading of the high level signal will be studied.

Column 9, lines 46–68:
In this embodiment, the resistor [12] *32* of the reference voltage generation circuit 21 of the first embodiment is replaced by a switched capacitor device which comprises two N-channel MOSFETs 37a and 37b connected in series, and a capacitor 38 linked to the connection of the two MOSFETs 37a and 37b. A pair of clock pulses $\phi$ and $\bar{\phi}$ having a frequency f is fed to one of the input terminals of NOR gates 36a and 36b, respectively, and the output signals of the NOR gates 36a and 36b are output to the gate electrodes of the MOSFETs 37a and 37b, respectively. In this case, the inverter 42 and the first and second transfer gates 44 and 45 in the first embodiment are omitted, and a pair of P-channel and N-channel MOSFETs 34 and 35 is provided instead of the MOSFETs 41 and 43 in the first embodiment. Thus, the drain electrodes of the MOSFETs 34 and 35 are connected to the gate electrodes of the P-channel and N-channel MOSFETs 31 and 33, respectively. A control signal fed to the control terminal 46 is sent to the gates of the MOSFETs 34 and 35 and to the other input terminals of the NOR [gate 36a] *gates 36a and 36b*. By feeding the clock pulses $\phi$ and $\bar{\phi}$ to the MOSFETs 37a and 37b via the NOR gates 36a and 36b, an equivalent resister $R_S$ is generated.

Column 10, lines 24–40:
In FIG. 13, there is shown the fourth embodiment of the output buffer circuit according to the present invention, having the same construction as that of the second embodiment shown in FIG. 11, except that the resistor [12] *32* of the reference voltage generation circuit 21 of the second embodiment is replaced by a switched capacitor device which comprises two N-channel MOSFETs 37a and 37b connected in series, and a capacitor 38 linked to the connection of the two MOSFETs 37a and 37b in the same manner as those of the third embodiment shown in FIG. 12. The clock pulses $\phi$ and $\bar{\phi}$ are fed to the gate electrodes of the MOSFETs 37a and 37b, respectively, to generate the equivalent resister $R_S$ in the same manner as that of the third embodiment. A capacitor 67a, indicated by a broken line in FIG. 13, is located after the output terminal 66 and represents a floating capacity in the load side connected thereto.

AS A RESULT OF REEXAMINATION, IT HAS BEEN DETERMINED THAT:

Claims 2, 4–7, 9, 11 and 12 are cancelled.

Claims 1, 3, 8 and 10 are determined to be patentable as amended.

1. An output buffer circuit, comprising:
   a pair of current sources connected to positive and negative power sources;
   a first inverter having input and output terminals, coupled between the positive and negative power sources *via said pair of current sources, respectively;*
   *another pair of current sources connected to the positive and negative power sources;*
   a second inverter having input and output terminals, coupled between the [current sources and] *positive and negative power sources via said another pair of current sources, respectively, the input terminal of the second inverter being* connected to the output terminal of the first inverter, the second inverter including at least one of P-channel and N-channel MOSFETs; [and]
   a capacitor connected between the input and output terminals of the second inverter; *and*
   *switching means connected between the input and output terminals of the second inverter in series with the capacitor, for opening and closing a path between the input and output terminals of the second inverter in response to an enable signal input to a control terminal thereof.*

3. The circuit of claim [2] *1*, further comprising a first reference voltage generation circuit for outputting voltages for driving the current sources.

8. The circuit of claim 1, further comprising:
   high impedance set means for activating the *second* inverter when an actuating signal is input to the high impedance set means, and for changing the *second* inverter from a low to high impedance condition when the actuating signal is not input to the high impedance set means; and
   current restriction means for moderating a current value variation of the actuating signal during the change between the low and high impedance conditions.

10. The circuit of claim [9] *1*, wherein the switching means is [an] *a* transfer gate means inserted [in] *on* an input side of the *second* inverter.

* * * * *